(12) United States Patent
Baba et al.

(10) Patent No.: US 9,293,405 B2
(45) Date of Patent: Mar. 22, 2016

(54) SEMICONDUCTOR DEVICE

(75) Inventors: Shinji Baba, Kanagawa (JP); Masaki Watanabe, Kanagawa (JP); Muneharu Tokunaga, Kanagawa (JP); Kazuyuki Nakagawa, Kanagawa (JP)

(73) Assignee: Renesas Electronics Corporation, Tokyo (JP)

( * ) Notice: Subject to any disclaimer, the term of this patent is extended or adjusted under 35 U.S.C. 154(b) by 0 days.

(21) Appl. No.: 14/006,614

(22) PCT Filed: Mar. 22, 2011

(86) PCT No.: PCT/JP2011/056801
§ 371 (c)(1),
(2), (4) Date: Sep. 20, 2013

(87) PCT Pub. No.: WO2012/127614
PCT Pub. Date: Sep. 27, 2012

(65) Prior Publication Data
US 2014/0008798 A1    Jan. 9, 2014

(51) Int. Cl.
*H01L 23/48* (2006.01)
*H01L 23/52* (2006.01)
(Continued)

(52) U.S. Cl.
CPC ........ *H01L 23/49816* (2013.01); *H01L 21/563* (2013.01); *H01L 23/49811* (2013.01); *H01L 23/49827* (2013.01); *H01L 24/14* (2013.01); *H01L 23/49822* (2013.01); *H01L 23/49838* (2013.01); *H01L 24/16* (2013.01);
(Continued)

(58) Field of Classification Search
USPC .......................................... 257/737, 738, 778
See application file for complete search history.

(56) References Cited

U.S. PATENT DOCUMENTS 6,335,566 B1 * 1/2002 Hirashima ........ H01L 23/49838
                                                              257/686
6,586,683 B2 * 7/2003 Arrington et al. ............ 174/255
(Continued)

FOREIGN PATENT DOCUMENTS

CN       101510538 A    8/2009
JP       2002-246552 A  8/2002
(Continued)

OTHER PUBLICATIONS

Office Action issued Sep. 2, 2014, in Japanese Patent Application No. 2013-505686.
(Continued)

*Primary Examiner* — Meiya Li
*Assistant Examiner* — Peter M Albrecht
(74) *Attorney, Agent, or Firm* — Shapiro, Gabor and Rosenberger, PLLC

(57) ABSTRACT

A technique capable of improving reliability of a semiconductor device is provided. In the present invention, as a wiring board on which a semiconductor chip is mounted, a build-up wiring board is not used but a through wiring board THWB is used. In this manner, in the present invention, the through wiring board formed of only a core layer is used, so that it is not required to consider a difference in thermal expansion coefficient between a build-up layer and the core layer, and besides, it is not required either to consider the electrical disconnection of a fine via formed in the build-up layer because the build-up layer does not exist. As a result, according to the present invention, the reliability of the semiconductor device can be improved while a cost is reduced.

19 Claims, 16 Drawing Sheets

(51) Int. Cl.
*H01L 29/40* (2006.01)
*H01L 23/498* (2006.01)
*H01L 21/56* (2006.01)
*H01L 23/00* (2006.01)

(52) U.S. Cl.
CPC ............. *H01L 24/32* (2013.01); *H01L 24/81* (2013.01); *H01L 2224/0401* (2013.01); *H01L 2224/05548* (2013.01); *H01L 2224/05567* (2013.01); *H01L 2224/1134* (2013.01); *H01L 2224/131* (2013.01); *H01L 2224/13007* (2013.01); *H01L 2224/13022* (2013.01); *H01L 2224/13024* (2013.01); *H01L 2224/13082* (2013.01); *H01L 2224/13144* (2013.01); *H01L 2224/13147* (2013.01); *H01L 2224/14136* (2013.01); *H01L 2224/14155* (2013.01); *H01L 2224/14177* (2013.01); *H01L 2224/16237* (2013.01); *H01L 2224/32225* (2013.01); *H01L 2224/73204* (2013.01); *H01L 2224/81191* (2013.01); *H01L 2224/81193* (2013.01); *H01L 2224/81815* (2013.01); *H01L 2224/83102* (2013.01); *H01L 2924/00014* (2013.01); *H01L 2924/01029* (2013.01); *H01L 2924/1306* (2013.01); *H01L 2924/13091* (2013.01); *H01L 2924/3512* (2013.01)

(56) References Cited

U.S. PATENT DOCUMENTS

| | | | |
|---|---|---|---|
| 7,087,458 B2 * | 8/2006 | Wang et al. | 438/108 |
| 2004/0087057 A1 | 5/2004 | Wang et al. | |
| 2006/0043572 A1 * | 3/2006 | Sugimoto et al. | 257/700 |
| 2007/0200249 A1 * | 8/2007 | Tanida et al. | 257/778 |
| 2008/0174004 A1 | 7/2008 | Nakagawa | |
| 2008/0302560 A1 * | 12/2008 | Tanno et al. | 174/255 |
| 2009/0194322 A1 | 8/2009 | Usui et al. | |

FOREIGN PATENT DOCUMENTS

| | | | | |
|---|---|---|---|---|
| JP | 2005-294482 A | | 10/2005 | |
| JP | 2007-123443 A | | 5/2007 | |
| JP | 2007123443 A | * | 5/2007 | |
| JP | 2008-177407 A | | 7/2008 | |
| JP | 2009-206506 A | | 9/2009 | |
| JP | 2010-283404 A | | 12/2010 | |
| JP | 2010-287646 A | | 12/2010 | |
| JP | 2010287646 A | * | 12/2010 | |
| WO | WO 2010/073831 A1 | | 7/2010 | |

OTHER PUBLICATIONS

Office Action issued Sep. 25, 2015, in Chinese Patent Application No. 201180069392.1.

Office Action, issued Dec. 28, 2015, in Taiwanese Application No. 100144689.

* cited by examiner

THWB

UF(NCP)

THWB

THWB

THWB

SEMICONDUCTOR DEVICE

TECHNICAL FIELD

The present invention relates to a semiconductor device, and, more particularly, the present invention relates to a technique effectively applied to a semiconductor device in which a semiconductor chip is mounted on a wiring board using a bump electrode (protruding electrode).

BACKGROUND ART

Japanese Patent Application Laid-Open Publication No. 2002-246552 (Patent Document 1) describes a technique of mounting a semiconductor chip on a wiring board by using a bump electrode which is an external connection terminal and which is formed on only a peripheral edge portion of the semiconductor chip having a rectangular shape.

PRIOR ART DOCUMENT

Patent Document

Patent Document 1: Japanese Patent Application Laid-Open Publication No. 2002-246552

DISCLOSURE OF THE INVENTION

Problems to be Solved by the Invention

A semiconductor device is composed of a semiconductor chip in which a semiconductor element such as a MOSFET (Metal Oxide Semiconductor Field Effect Transistor) and a multilayer wiring are formed and a package which is formed so as to cover the semiconductor chip. The package has functions such as a function (1) of electrically connecting a semiconductor element formed on the semiconductor chip with an external circuit, and a function (2) of protecting the semiconductor chip from external environment such as temperature or moisture so as to prevent breakage due to vibrations or impact or characteristic degradation of the semiconductor chip. Further, the package has functions such as a function (3) of facilitating to handle the semiconductor chip, and a function (4) of diffusing heat generated in operation of the semiconductor chip so as to maximize functions of the semiconductor element. As the package having such functions, there are various types.

A configuration example of the package will be described below. For example, there is a BGA (Ball Grid Array) package of a type in which a semiconductor chip is mounted on a wiring board by using a bump electrode (protruding electrode) serving as an external connection terminal which is formed on a surface of the semiconductor chip. In this BGA package, a build-up wiring board in which wirings are easy to be formed at a fine pitch (narrow pitch) is used in response to achievement of high density and narrow pitching of bump electrodes formed on the semiconductor chip. As an example of a structure of the build-up wiring board, for example, there is such a structure having build-up layers so as to sandwich a core layer therebetween. Further, in the build-up layers, a fine via is formed, and this via can be freely arranged. Further, a terminal is arranged on the fine via. A reason of this will be described. A via diameter of the fine via formed in the build-up layer is fine (miniaturized), and therefore, it is easy to fill a conductor film inside the via. As a result, such a state that an upper portion of the via is covered (plugged) with the conductor film can be created, and therefore, secure electric connection between the via and the terminal can be achieved even if the terminal is arranged on the via. In this manner, since the terminal can be arranged even on the fine via, the build-up wiring board has such an advantage as less restriction in the formation of the wiring so that the wiring is easy to be formed at the fine pitch.

However, from the study made by the present inventors, it has been newly found that the build-up wiring board has the following problem. The problem will be explained. First of all, a reason why the build-up wiring board has the core layer and the build-up layers formed so as to sandwich the core layer therebetween will be explained.

For example, when the semiconductor device operates, the semiconductor chip generates heat, and heat due to the heat generation is transferred from the semiconductor chip to the build-up wiring board. As a result, the heat is transferred to the build-up wiring board, and the build-up wiring board is expanded. If the expansion of the build-up wiring board increases, stress acts on a sealing resin (such as an underfill material) for sealing a space between the build-up wiring board and the semiconductor chip, and a crack occurs in some cases at, for example, an interface between the semiconductor chip and the sealing resin or an interface between the sealing resin and the build-up wiring board, which results in deterioration of reliability of the semiconductor device. Therefore, in order to reduce a thermal expansion coefficient ($\alpha$) of the build-up wiring board as much as possible (in order to bring the thermal expansion coefficient to a thermal expansion coefficient of the semiconductor chip), a core layer containing glass cloth which is a fabric cloth made of glass fiber is provided to reduce the thermal expansion coefficient of the build-up wiring board. However, if the build-up wiring board is formed of only the core layer containing the glass cloth, it is difficult to form the fine via. Therefore, normally, in the build-up wiring board, the fine via can be formed by providing the build-up layers so as to sandwich the core layer therebetween without containing the glass cloth in the build-up layers. That is, since the build-up layers are configured not to contain the glass cloth, the fine via can be formed. However, even in the build-up layers, it is required to reduce the thermal expansion coefficient, and therefore, glass filler (granular or beaded glass) is added instead of the glass cloth. From the above-described reason, the build-up wiring board is formed of the core layer and the build-up layers formed so as to sandwich the core layer therebetween.

Here, as described above, the glass cloth is contained in the core layer whereas the glass filler is contained in the build-up layers instead of the glass cloth. However, the thermal expansion coefficient of the build-up layer containing the glass filler is not reduced as small as the thermal expansion coefficient of the core layer containing the glass cloth. As one example, the thermal expansion coefficient of the core layer is about 17 to 20 ppm, and the thermal expansion coefficient of the build-up layer is about 40 to 60 ppm. As a result, the build-up layer and the core layer are different from each other in thermal expansion coefficient, thermal stress due to the difference in thermal expansion coefficient is applied between the build-up layer and the core layer. And, the present inventors have found such a risk that the fine via formed in the build-up layer is easily electrically disconnected by this thermal stress, which results in decrease in the reliability of the semiconductor device in the future.

A preferred aim of the present invention is to provide a technique capable of improving the reliability of the semiconductor device.

The above and other preferred aims and novel characteristics of the present invention will be apparent from the description of the present specification and the accompanying drawings.

Means for Solving the Problems

The summary of the typical ones of the inventions disclosed in the present application will be briefly described as follows.

A feature of a semiconductor device according to a typical embodiment is not to use a build-up layer but use a through wiring board as a wiring board on which a semiconductor chip is mounted.

Effects of the Invention

The effects obtained by typical aspects of the present inventions disclosed in the present application will be briefly described below.

It is not required to consider the difference in thermal expansion coefficient between the build-up layer and the core layer, and besides, it is not required to consider the electrical disconnection of the fine via formed in the build-up layer because the build-up layer does not exist. As a result, the reliability of the semiconductor device can be improved while achieving cost reduction.

BRIEF DESCRIPTIONS OF THE DRAWINGS

BEST MODE FOR CARRYING OUT THE INVENTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof.

Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specified number is also applicable.

Further, in the embodiments described below, it goes without saying that the components (including element steps) are not always indispensable unless otherwise stated or except the case where the components are apparently indispensable in principle.

Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Also, the same components are denoted by the same reference symbols in principle throughout all drawings for describing the embodiments, and the repetitive description thereof is omitted. Note that hatching is used even in a plan view so as to make the drawings easy to see.

Explanation of Problem Using Drawings

Figure 1:
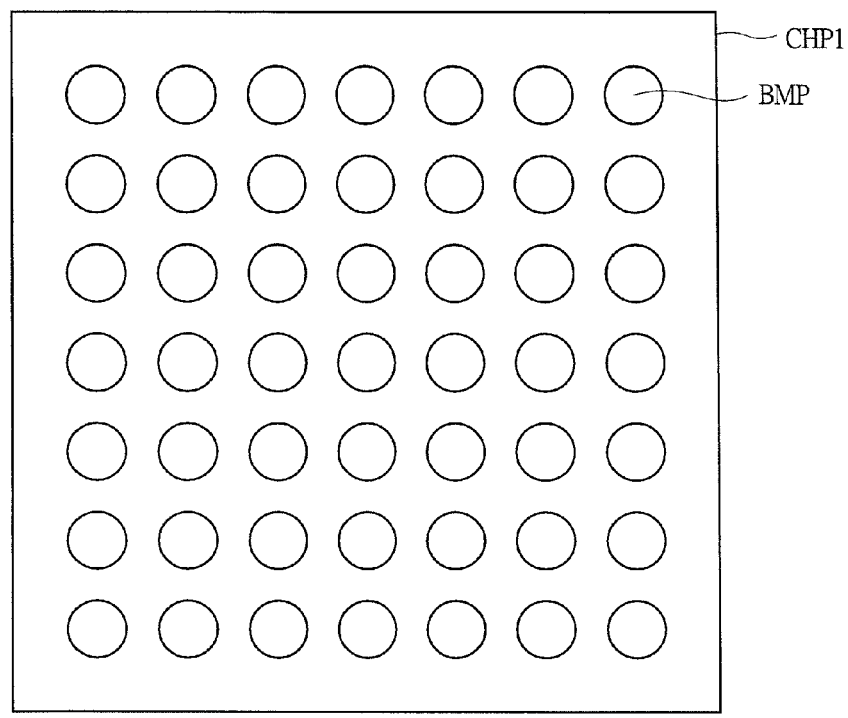
FIG. 1 is a top view illustrating an appearance configuration of a semiconductor chip studied by the present inventors.

First, the problem included in the semiconductor device which has been studied by the present inventors will be described with reference to the drawings. FIG. 1 is a top view illustrating an appearance configuration of a semiconductor chip CHP1 which has been studied by the present inventors. As illustrated in FIG. 1, the semiconductor chip CHP1 has a rectangular shape, and bump electrodes BMP which are external connection terminals are formed over a whole surface of the semiconductor chip CHP1. By packaging the semiconductor chip CHP1 configured as described above, the semiconductor device which has been studied by the present inventors can be obtained.

Figure 2:
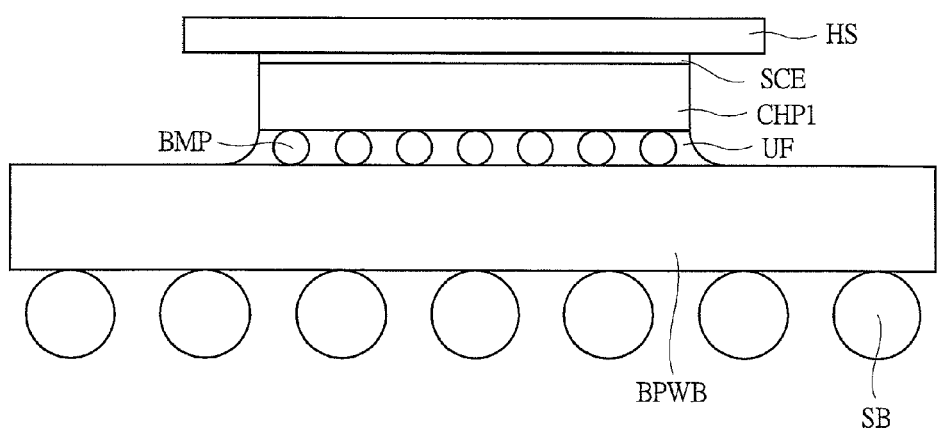
FIG. 2 is a side view illustrating a configuration of a semiconductor device studied by the present inventors.

FIG. 2 is a side view illustrating a configuration of the semiconductor device which has been studied by the present inventors. As illustrated in FIG. 2, the semiconductor device which has been studied by the present inventors has a build-up wiring board BPWB, and a plurality of solder balls SB are formed on a back surface (lower surface) of the build-up wiring board BPWB. On the other hand, the semiconductor chip CHP1 is mounted on a front surface (upper surface) of the build-up wiring board BPWB. At this time, the semiconductor chip CHP1 is arranged on the build-up wiring board BPWB so that a plurality of bump electrodes BMP formed on the semiconductor chip CHP1 are electrically connected to terminals (not illustrated) formed on the front surface of the build-up wiring board BPWB. And, an underfill UF which is a sealing resin is filled in a space formed between the semiconductor chip CHP1 and the build-up wiring board BPWB. The underfill UF is an epoxy resin so often to be used to secure the connection reliability between the semiconductor chip CHP1 and the build-up wiring board BPWB. Further, on an upper surface of the semiconductor chip CHP1, a heat sink HS is arranged via a silicon resin SCE. The heat sink HS is provided so that the heat generated in the semiconductor chip CHP1 is efficiently diffused to the outside. That is, the heat sink HS is provided in order to improve the efficiency of the heat diffusion of the semiconductor chip CHP1.

Figure 3:
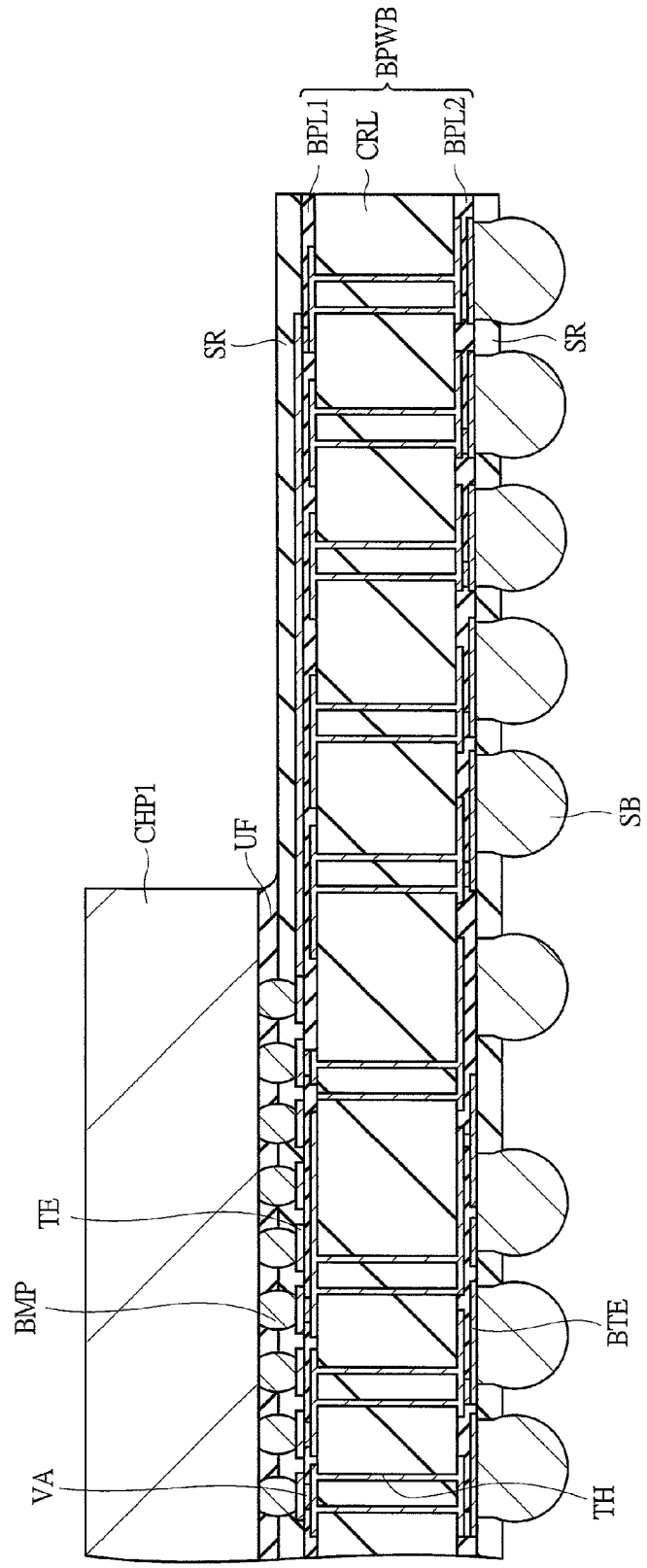
FIG. 3 is a view illustrating a part of the semiconductor device studied by the present inventors, which is a view illustrating an internal configuration of a build-up board.

Regarding the semiconductor device configured as described above, which has been studied by the present inventors, an internal structure of the build-up wiring board BPWB will be specially explained in more detail. FIG. 3 is a view illustrating a part of the semiconductor device which has been studied by the present inventors, which is a view illustrating the internal structure of the build-up wiring board BPWB. As illustrated in FIG. 3, the build-up wiring board BPWB is formed of a core layer CRL, a build-up layer BPL1 and a build-up layer BPL2 arranged so as to sandwich the core layer CRL therebetween.

More specifically, through-holes TH are formed in the core layer CRL, and multilayer wirings (two layers in FIG. 3) connected to the through-holes TH are formed in the build-up layer BPL1. The multilayer wirings are connected to each other through vias VA formed in the build-up layer BPL1. A solder resist SR is formed on a surface of the build-up layer BPL1, and terminals (land patterns, foot patterns) TE configuring the build-up layer BPL1 are exposed from openings provided in the solder resist SR. And, the semiconductor chip CHP1 is mounted on the build-up wiring board BPWB so that the terminals TE and the bump electrodes BMP are electrically connected to each other.

On the other hand, also in the build-up layer BPL2, multilayer wirings (two layers in FIG. 3) connected to the through holes TH formed in the core layer CRL are formed. A solder resist SR is formed on a surface of the build-up layer BPL2, and back-surface terminals BTE configuring the build-up layer BPL2 are exposed from openings provided in the solder resist SR. And, solder balls SB are mounted on the back-surface terminals BTE so as to be electrically connected to the back-surface terminals BTE. More specifically, in the build-up wiring board BPWB illustrated in FIG. 3, a total board thickness of the core layer CRL (about 0.8 mm), the build-up layer BPL1, and the build-up layer BPL2 is about 1.0 mm, each diameter of the through-holes TH is about 150 to 250 µm, and each diameter of the vias VA is about 50 µm.

The build-up wiring board BPWB configured as described above has such an advantage that it is easy to form fine-pitched wirings in response to achievement of high density of the bump electrodes BMP formed in the semiconductor chip CHP1. That is, the build-up wiring board BPWB has, for example, the build-up layer BPL1 and the build-up layer BPL2 formed so as to sandwich the core layer CRL therebetween, and the build-up layer BPL1 and the build-up layer BPL2 are formed with the fine vias VA, and the vias VA can be freely arranged. Further, the terminals TE can be arranged on the fine vias VA. A reason of this will be explained. Since each via diameter of the fine vias VA formed in the build-up layer BPL1 and the build-up layer BPL2 is fine, it is easy to fill a conductor film into the vias VA. As a result, such a state that the upper portions of the vias VA are covered with the conductor film can be created, and therefore, reliable electric connections between the via VA and the terminal TE can be achieved even if the terminal TE are arranged on the via VA. As described above, in the build-up wiring board BPWB, the terminal TE can be arranged even on the fine via VA, and therefore, there is an advantage of less restriction in the wiring formation so as to easily form the fine-pitched wiring.

Further, as illustrated in FIG. 3, in the build-up wiring board BPWB, a plate film is formed on a wall surface of the through-hole TH formed in the core layer CRL whereas the plate film is not formed inside the through-hole TH because the diameter of the through-hole TH is large. However, as illustrated in FIG. 3, hole-plugging resin is embedded inside the through-hole TH, and is filled inside the through-hole TH. Therefore, in the build-up wiring board BPWB illustrated in FIG. 3, the fine via VA or the wiring can be arranged even on the through-hole TH, so that this point also achieves the less restriction in the wiring formation so as to easily form the fine-pitched wiring.

However, in the study made by the present inventors, it has been newly found that the above-described build-up wiring board BPWB has the following problem. For example, when the semiconductor device operates, the semiconductor chip CHP1 generates heat and heat due to the heat generation is transferred from the semiconductor chip CHP1 to the build-up wiring board BPWB. As a result, the heat is applied to the build-up wiring board BPWB, and the build-up wiring board BPWB expands. When the expansion of the build-up wiring board BPWB increases, stress acts on a sealing resin (underfill UF) for sealing a space between the build-up wiring board BPWB and the semiconductor chip CHP1, and therefore, a crack occurs at, for example, an interface between the semiconductor chip and the sealing resin or an interface between the sealing resin and the build-up wiring board in some cases, which results in deterioration of reliability of the semiconductor device. Therefore, in order to reduce the thermal expansion coefficient ($\alpha$) of the build-up wiring board BPWB (in order to bring the thermal expansion coefficient to a thermal expansion coefficient of the semiconductor chip CHP1), a core layer CRL containing glass cloth which is a fabric cloth made of glass fiber is provided to reduce the thermal expansion coefficient of the build-up wiring board BPWB. However, if the build-up wiring board BPWB is formed of only the core layer CRL containing the glass cloth, it is difficult to form the fine via VA. Therefore, normally, in the build-up wiring board BPWP, the fine via is formed by providing the build-up layers BPL1 (BPL2) so as to sandwich the core layer CRL therebetween without containing the glass cloth in the build-up layers BPL1 (BPL2). That is, since the build-up layers BPL1 (BPL2) are configured not to contain the glass cloth, the fine via VA can be formed. However, even in the build-up layers BPL1 (BPL2), it is required to reduce the thermal expansion coefficient, and therefore, glass filler (granular or beaded glass) is added instead of the glass cloth.

Here, as described above, the glass cloth is contained in the core layer CRL whereas the glass filler is contained in the build-up layers BPL1 (BPL2) instead of the glass cloth. However, the thermal expansion coefficient of the build-up layer BPL1 (BPL2) containing the glass filler is not reduced as small as the thermal expansion coefficient of the core layer CRL containing the glass cloth. As one example, the thermal expansion coefficient of the core layer is about 17 to 20 ppm, and the thermal expansion coefficient of the build-up layer is about 40 to 60 ppm. As a result, the build-up layer BPL1 (BPL2) and the core layer CRL are different from each other in the thermal expansion coefficient, thermal stress due to the difference in the thermal expansion coefficient is applied between the build-up layer BPL1 (BPL2) and the core layer CRL. And, the present inventors have found such a risk that the fine via VA formed in the build-up layer BPL1 (BPL2) is easily electrically disconnected by this thermal stress, which results in decrease in the reliability of the semiconductor device. Accordingly, in the present embodiment, devisal for improving the reliability of the semiconductor device is performed. The devised semiconductor device according to the present embodiment will be explained below.

Configuration of Semiconductor Device According to Present Embodiment

Figure 4:
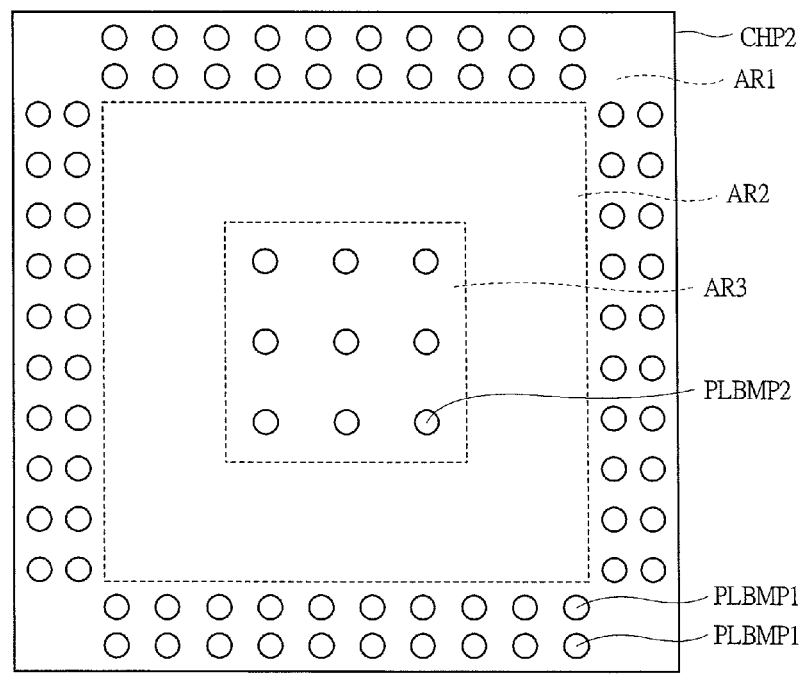
FIG. 4 is a view illustrating a surface configuration of a semiconductor chip according to an embodiment.

FIG. 4 is a view illustrating a surface structure of a semiconductor chip CHP2 according to the present embodiment. As illustrated in FIG. 4, the semiconductor chip CHP2 according to the present embodiment has a rectangular shape, and a pillar-shaped bump electrode (pillar-shaped protruding electrode) PLBMP1 and a pillar-shaped bump electrode PLBMP2 are formed on a surface area of the semiconductor chip CHP2. Note that each of these pillar-shaped bump electrode PLBMP1 and pillar-shaped bump electrode PLBMP2 is formed of, for example, a pillar-shaped portion made of copper (Cu) and a connection portion made of solder and formed on the pillar-shaped portion. For example, here, a height of the pillar-shaped portion is about 30 µm, and a height (solder height) of the connection portion is about 15 µm. A shape of the pillar-shaped portion is a cylindrical shape or a rectangular parallelepiped shape, and a diameter thereof having the cylindrical shape is about 30 to 35 µm, and a length of one side thereof having the rectangular parallelepiped shape is about 30 to 35 µm in a plan view.

More specifically, in the semiconductor chip CHP2 according to the present embodiment, in a case that the surface area of the semiconductor chip CHP2 is divided into an area AR1, an area AR2 positioned inside the area AR1, and an area AR3 positioned inside the area AR2 as illustrated in FIG. 4, a plurality of pillar-shaped bump electrodes PLBMP1 are formed in the area AR1, and a plurality of pillar-shaped bump electrodes PLBM2 are formed in the area AR3. That is, the pillar-shaped bump electrodes PLBMP1 and the pillar-shaped bump electrodes PLBM2 are arranged so as to separate from each other via the area AR2. In this case, the plurality of pillar-shaped bump electrodes PLBMP1 are formed in a plurality of rows (two rows in FIG. 4) in the area AR1, and the plurality of pillar-shaped bump electrodes PLBMP2 are equally formed in the area AR3.

Note that, here, the minimum pitch between the respective bumps of the pillar-shaped bump electrodes PLBMP1 arranged in the area AR1 is set to be smaller than the minimum pitch between the respective bumps of the pillar-shaped bump electrodes PLBMP2 arranged in the area AR2. The minimum pitch between the respective bumps of the pillar-shaped bump electrodes PLBMP1 arranged in the area AR1 is about 40 to 60 µm here. However, even if the minimum pitch between the respective bumps of the pillar-shaped bump electrodes PLBM1 is equal to or larger than the minimum pitch between the respective bumps of the pillar-shaped bump electrodes PLBM2, there is no special problem.

On the other hand, in the area AR2, neither the pillar-shaped bump electrodes PLBMP1 nor the pillar-shaped bump electrodes PLBMP2 are formed.

That is, as a feature point of the semiconductor chip CHP2 according to the present embodiment, the pillar-shaped bump electrodes PLBMP1 (PLBMP2) are not formed on the whole surface of the semiconductor chip CHP2, but the pillar-shaped bump electrodes PLBMP1 (PLBMP2) are formed in only the area AR1 and the area AR3 whereas the pillar-shaped bump electrodes PLBMP1 (PLBMP2) are not formed in the area AR2. For example, it is understood that the bump electrodes BMP are formed on the whole surface of the semiconductor chip CHP1 in the semiconductor chip CHP1 illustrated in FIG. 1 which has been studied by the present inventors, whereas the pillar-shaped bump electrodes PLBMP1 (PLBMP2) are formed in only the area AR1 and the area AR3 but the pillar-shaped bump electrodes PLBP1 (PLBMP2) are not formed in the area AR2 in the semiconductor chip CHP2 illustrated in FIG. 4 according to the present embodiment.

Figure 5:
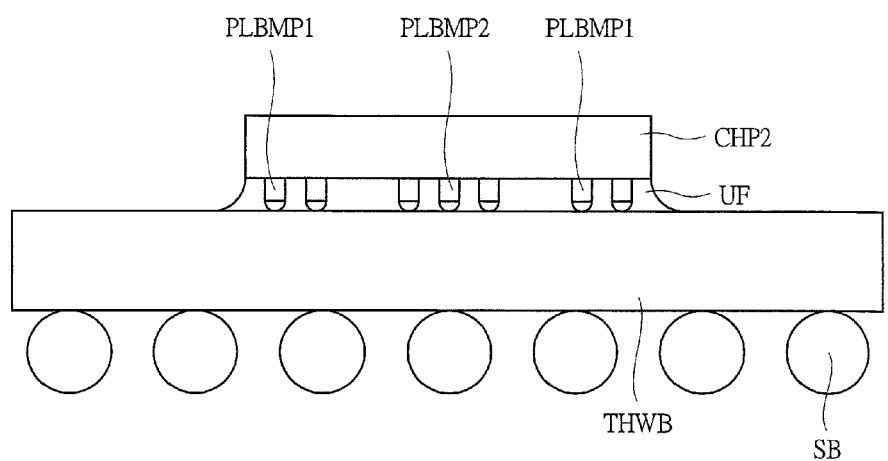
FIG. 5 is a side view illustrating a configuration of a semiconductor device according to the embodiment.

Subsequently, a configuration of the semiconductor device according to the present embodiment will be explained. FIG. 5 is a side view illustrating the configuration of the semiconductor device according to the present embodiment. As illustrated in FIG. 5, the semiconductor device according to the present embodiment has a through wiring board THWB, and a plurality of solder balls SB are formed on a back surface (lower surface) of the through wiring board THWB. On the other hand, on a front surface (upper surface) of the through wiring board THWB, the semiconductor chip CHP2 is mounted. At this time, the semiconductor chip CHP2 is arranged on the through wiring board THWB so that the plurality of pillar-shaped bump electrodes PLBMP1 and the plurality of pillar-shaped bump electrodes PLBMP2 formed on the semiconductor chip CHP2 are electrically connected to terminals (not illustrated) formed on the front surface of the through wiring board THWB. And, an underfill UF which is a sealing resin is filled in a space between the semiconductor chip CHP2 and the through wiring board THWB. The underfill UF is an epoxy resin often, and is used to secure connection reliability between the semiconductor chip CHP2 and the through wiring board THWB.

Figure 6:
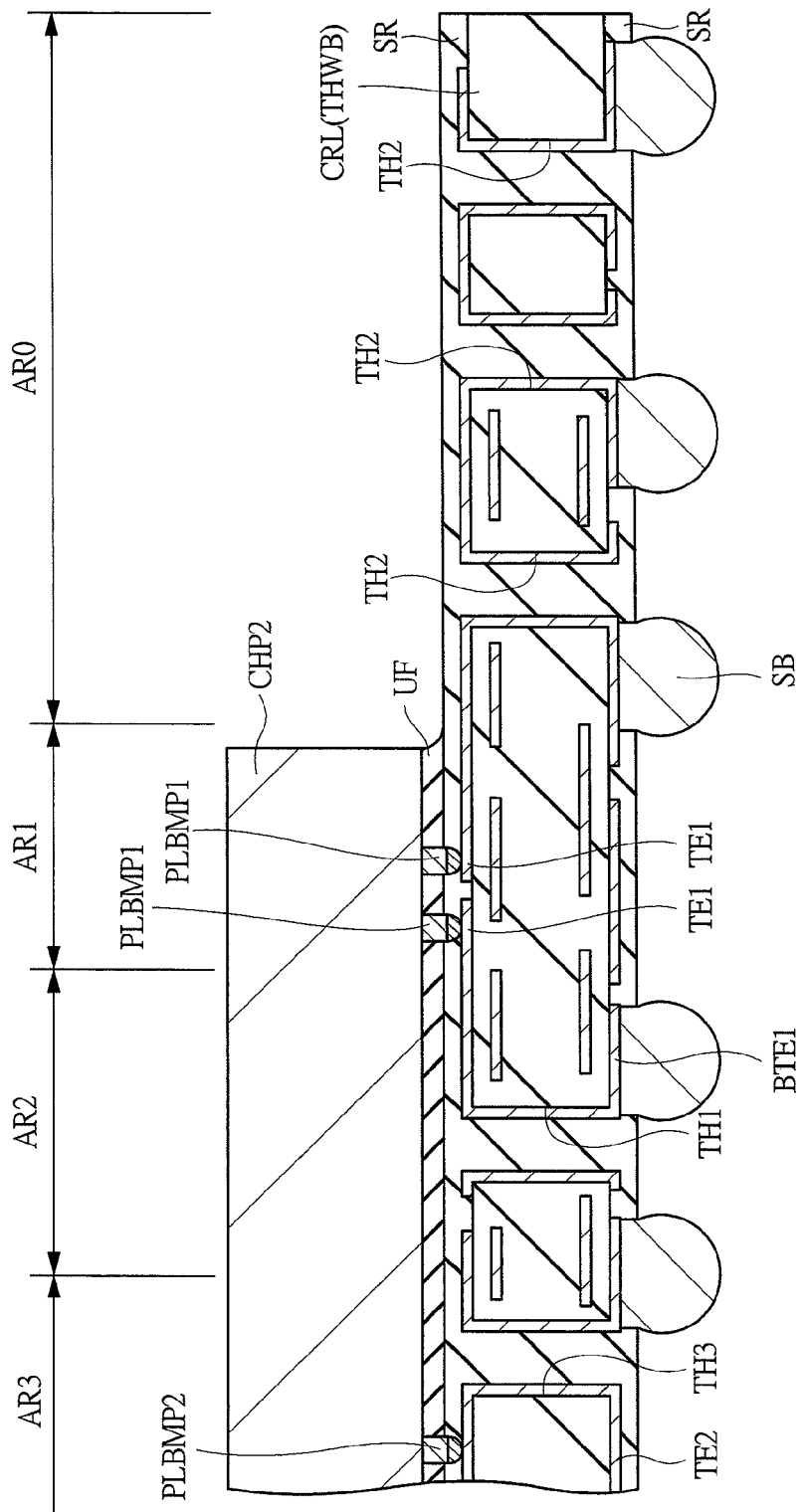
FIG. 6 is a view illustrating a part of the semiconductor device according to the embodiment, which is a view illustrating an internal configuration of a through wiring board.

Regarding the semiconductor device according to the present embodiment configured as described above, an internal structure of the through wiring board THWB will be especially explained in more detail. FIG. 6 is a view illustrating a part of the semiconductor device according to the present embodiment, which is a view illustrating the internal structure of the through wiring board THWB. As illustrated in FIG. 6, in the present embodiment, the through wiring board THWB is formed of the core layer CRL containing the glass cloth. In the through wiring board THWB, through-holes TH1, TH2, and TH3 penetrating from the front surface (upper surface) of the through wiring board THWB to the back surface (lower surface) thereof are formed. And, a solder resist SR (first solder resist) is formed on the front surface of the through wiring board THWB, and the solder resist SR is also filled inside the through-holes TH1, TH2, and TH3. Openings are formed in the solder resist SR, and a plurality of terminals (land patterns, foot patterns) TE1 and a plurality of terminals (land patterns, foot patterns) TE2 are exposed from the openings.

For example, the plurality of terminals TE1 are formed on the front surface of the through wiring board THWB, and some of the plurality of terminals TE1 are electrically connected to the through-holes TH1 on the front surface of the through wiring board THWB, and the others of the plurality of terminals TE1 are electrically connected to the through-holes TH2 on the front surface of the through wiring board THWB. Also, the plurality of terminals TE2 are also formed on the front surface of the through wiring board THWB, and the plurality of terminals TE2 are electrically connected to the through-holes TH3 on the front surface of the through wiring board THWB. At this time, the semiconductor chip CHP2 is mounted on the front surface of the through wiring board THWB, and the pillar-shaped bump electrodes PLBMP1 formed on the semiconductor chip CHP2 and the terminals TE1 formed on the front surface of the through wiring board THWB are electrically connected to each other. Similarly, the pillar-shaped bump electrodes PLBMP2 formed on the semiconductor chip CHP2 and the terminals TE2 formed on the front surface of the through wiring board THWB are electrically connected to each other. That is, it can be said that the through wiring board THWB has a structure in which only one wiring layer is provided on each of the front surface and the back surface of the core layer CRL whereas the semiconductor device according to the present embodiment has a structure in which the pillar-shaped bump electrodes are electrically connected to the wiring layer directly.

On the other hand, a solder resist SR (second solder resist) is also formed on the back surface of the through wiring board THWB. And, openings are formed in the solder resist SR, and a plurality of back-surface terminals BTE are exposed from the openings. These back-surface terminals BTE are electrically connected to the through-holes TH1, TH2, and TH3 on the back surface of the through wiring board THWB, and solder balls SB are mounted on the back-surface terminals BTE. More specifically, in the through wiring board THWB according to the present embodiment, a board thickness (in consideration of wiring thicknesses of the front surface and the back surface) due to the core layer CRL (having a thickness of about 0.4 mm) is about 0.5 mm, and a through-hole diameter is about 150 μm.

The features of the present embodiment are the formation positions of the through-holes TH1, TH2, and TH3 formed in the through wiring board THWB and the formation positions of the terminals TE1 and the terminals TE2 formed on the front surface of the through wiring board THWB, and therefore, a schematic configuration of the features is also explained. First, in FIG. 6, the semiconductor chip CHP2 is mounted on the through wiring board THWB, and the through wiring board THWB is divided into areas as described below. That is, on the through wiring board THWB as illustrated in FIG. 6, an outer area in which the semiconductor chip CHP2 is not mounted is defined as an area AR0. And, the area on the semiconductor chip CHP2 is divided into an area AR1 of the semiconductor chip CHP2, an area AR2 of the semiconductor chip CHP2, and an area AR3 of the semiconductor chip CHP2 so as to correspond to the area sections illustrated in FIG. 4. In this manner, the front surface area of the through wiring board THWB can be divided into the above-described four areas.

Here, the area AR0 will be explained. In the through wiring board THWB, the plurality of through-holes TH2 are formed in the area AR0. That is, in the area AR0 of the front surface area of the through wiring board THWB, the plurality of through-holes TH2 are formed whereas the terminals TE1 and the terminals TE2 are not formed. More specially, the through-holes TH2 are electrically connected to the terminals TE1. However, the terminals TE1 are not formed in the area AR0 in which the through-holes TH2 are formed.

Subsequently, the area AR1 will be explained. In the through wiring board THWB, the plurality of terminals TE1 are formed in the area AR1. That is, in the area AR1 of the front surface area of the through wiring board THWB, the plurality of terminals TE1 are formed whereas the through-holes TH1, TH2, and TH3 are not formed. More specially, some terminals TE1 of the plurality of terminals TE1 are electrically connected to the through-holes TH1, the other terminals TE1 of the plurality of terminals TE1 are electrically connected to the through-holes TH2. However, these through-holes TH1 and through-holes TH2 are not formed in the area AR1 in which the terminals TE1 are formed. Note that the plurality of pillar-shaped bump electrodes PLBMP1 are formed in the area AR1 of the semiconductor chip CHP2, and the pillar-shaped bump electrodes PLBMP1 formed in the area AR1 of the semiconductor chip CHP2 are directly connected to the terminals TE1 formed in the area AR1 of the through wiring board THWB.

Next, the area AR2 will be explained. In the through wiring board THWB, the plurality of through-holes TH1 are formed in the area AR2. That is, in the area AR2 of the front surface area of the through wiring board THWB, the plurality of through-holes TH1 are formed whereas the terminals TE1 and the terminals TE2 are not formed. More specially, the through-holes TH1 are electrically connected to the terminals TE1. However, the terminals TE1 are not formed in the area AR2 in which the through-holes TH1 are formed.

Further, the area AR3 will be explained. In the through wiring board THWB, the plurality of through-holes TH3 and the plurality of terminals TE2 are formed in the area AR3. That is, in the area AR3 of the front surface area of the through wiring board THWB, the plurality of through-holes TH3 and the plurality of terminals TE2 are formed in the same area as each other. More specially, the through-holes TH3 are electrically connected to the terminals TE2, and the terminals TE2 are also formed in the area AR3 in which the through-holes TH3 are formed. Note that the plurality of pillar-shaped bump electrodes PLBMP2 are formed in the area AR3 of the semiconductor chip CHP2, and the pillar-shaped bump electrodes PLBMP2 formed in the area AR3 of the semiconductor chip CHP2 are directly connected to the terminals TE2 formed in the area AR3 of the through wiring board THWB.

Figure 7:
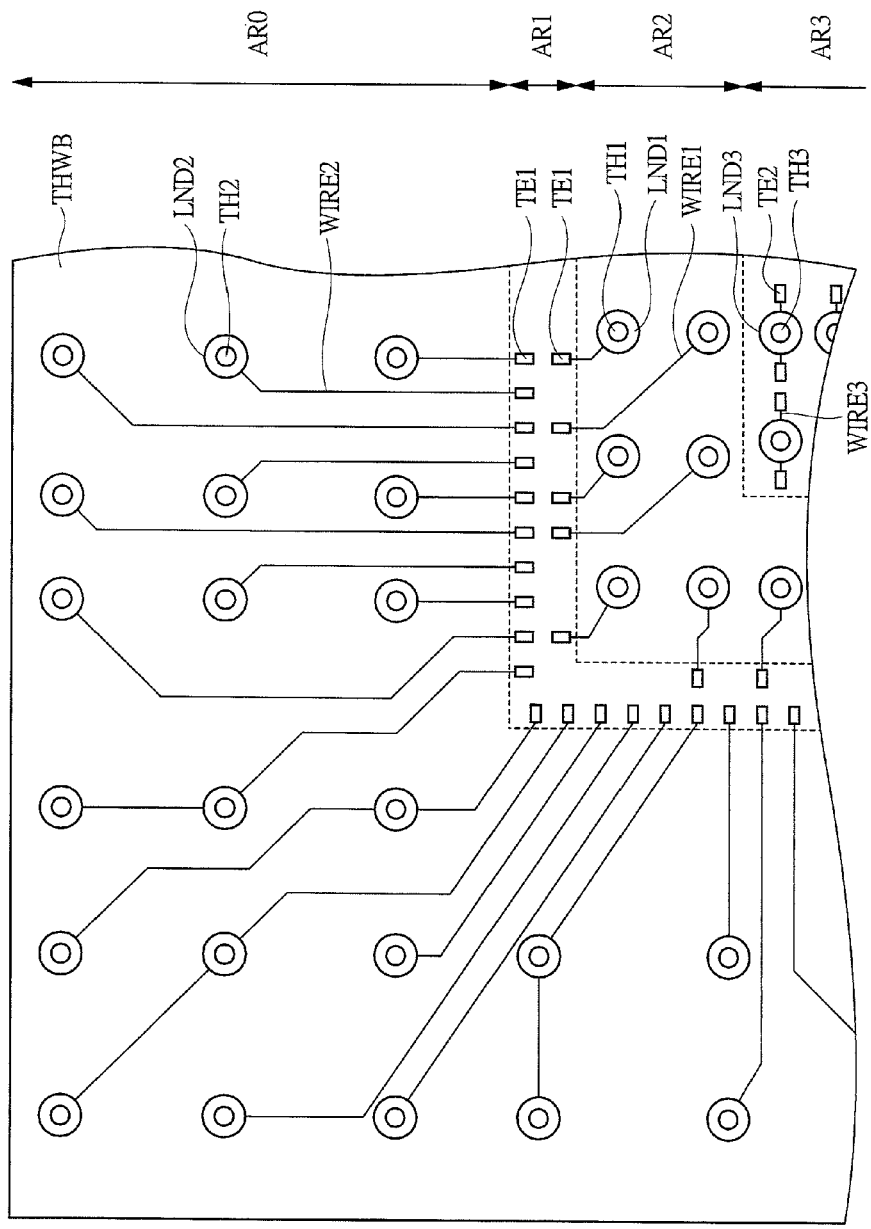
FIG. 7 is a plan view illustrating a partial configuration of the through wiring board according to the embodiment.

The through wiring board THWB according to the present embodiment is configured as described above, and the configuration will be explained with reference to a plan view so as to clarify the positional relationship among the through-holes TH1, TH2, and TH3 and the terminals TE1 and TE2. FIG. 7 is a plan view illustrating a partial configuration of the through wiring board THWB according to the present embodiment. FIG. 7 illustrates about ¼ area of the whole area of the through wiring board THWB. Further, FIG. 7 illustrates the area AR0, the area AR1, the area AR2, and the area AR3.

Here, as seen from FIGS. 6 and 7, the area AR0 is an area positioned outer than an outer periphery of the semiconductor chip CHP2 in a plan view. In other words, it can be said that the area AR0 is an area which does not overlap with the semiconductor chip CHP in the plan view. Further, the area AR1, the area AR2, and the area AR3 are areas positioned inner than the outer periphery of the semiconductor chip CHP2 in the plan view. In other words, it can also be said that the area AR1, the area AR2, and the area AR3 are areas which overlap with the semiconductor chip CHP in the plan view.

In FIG. 7, the plurality of terminals TE1 are formed in the area AR1. More specifically, in the area AR1, the plurality of terminals TE1 are formed in two rows so that, for example, the number of the terminal TE1 arranged in an outer row is larger than the number of the terminals TE1 arranged in an inner row. And, the terminals TE1 arranged in the outer row are electrically connected to the through-holes TH2 formed in the area AR0. More specifically, in the area AR0, the plurality of through-holes TH2 are formed, and lands LND2 are formed so as to contact with the through-holes TH2. And, the lands LND2 and the terminal TE1 arranged in the outer row are connected to each other by wirings WIRE2.

On the other hand, the terminals TE1 arranged in the inner row are electrically connected to the through-holes TH1 formed in the area AR2. More specifically, in the area AR2, the plurality of through-holes TH1 are formed, and lands LND1 are formed so as to contact with the through-holes TH1. And, the lands LND1 and the terminal TE1 arranged in the inner row are connected to each other by wirings WIRE1.

Subsequently, the plurality of through-holes TH3 and the plurality of terminals TE2 are formed in the area AR3. the terminals TE2 formed in the area AR3 are electrically connected to the through-holes TH3 formed in the same area AR3. More specifically, in the area AR3, the plurality of through-holes TH3 are formed, and lands LND3 are formed so as to contact with the through-holes TH3. And, the lands LND3 and the terminal TE2 are connected to each other by wirings WIRE3. That is, the terminal TE1 and the terminal TE2 are separated from each other so as to interpose the area AR2 therebetween.

Feature of Semiconductor Device According to Present Embodiment

The semiconductor device according to the present embodiment is configured as described above, and feature points thereof will be explained in detail below. First, a first feature point according to the present embodiment is that, for example, the through wiring board THWB is adopted as a wiring board on which the semiconductor chip CHP2 is mounted as illustrated in FIG. 6. That is, in the present embodiment, a build-up wiring board BPWB as illustrated in FIG. 3 is not used but a through wiring board THWB as illustrated in FIG. 6 is used.

For example, in the build-up wiring board BPWB as illustrated in FIG. 3, from the difference in the material between the core layer CRL containing the glass cloth and the build-up layers BPL1 (BPL2) containing the glass filler instead of the glass cloth, a difference in the thermal expansion coefficient (α) exists between the core layer CRL and the build-up layers BPL1 (BPL2). And, when the semiconductor chip CHP1 is heated so that thermal load is applied to the build-up wiring board BPWB, thermal stress is applied onto the fine vias VA formed in the build-up layers BPL1 (BPL2) due to the difference in the thermal expansion coefficient between the core layer CRL and the build-up layers BPL1 (BPL2), and the fine vias VA are easily electrically disconnected. As a result, the reliability of the semiconductor device is reduced.

On the other hand, in the present embodiment, the build-up wiring board BPWB is not used but the through wiring board THWB is used. For example, as illustrated in FIG. 6, while the through wiring board THWB is formed of only the core layer CRL containing the glass cloth, the build-up layers BPL1 (BPL2) are not provided. Therefore, in the through wiring board THWB, the electrical disconnection of the fine vias formed in the build-up layers BPL1 (BPL2) due to the difference in the thermal expansion coefficient between the core layer CRL and the build-up layers BPL1 (BPL2) does not occur. That is, in the through wiring board THWB, originally, there is no build-up wiring layer BPL1 (BPL2), and therefore, there is no fine via formed in the build-up layer BPL1 (BPL2), so that such a problem as the electrical disconnection of the fine via can be avoided. As described above, in the present embodiment, it is not required to consider the difference in the thermal expansion coefficient between the build-up layers BPL1 (BPL2) and the core layer CRL since the through wiring board THWB formed of only the core layer CRL is used, and besides, it is not required to consider the electrical disconnection of the fine via VA formed in the build-up layers BPL1 (BPL2) since there is no build-up layer BPL1 (BPL2). As a result, according to the present embodiment, the reliability of the semiconductor device can be improved.

Further, since the build-up layers BPL1 (BPL2) having the large thermal expansion coefficient is formed in the build-up wiring board BPWB, large thermal stress tends to act on the sealing resin (underfill UF) for sealing the space between the build-up wiring board BPWB and the semiconductor chip CHP1, and therefore, such a potential that the cracks occur in the sealing resin becomes high. On the other hand, in the present embodiment, the through wiring board THWB in which the build-up wiring layers BPL1 (BPL2) having the large thermal expansion coefficient are not formed and which is formed of only the core layer CRL having the small thermal expansion coefficient is used. Therefore, the thermal stress as large as the thermal stress in the case of the usage of the build-up wiring board BPWB is used is difficult to act on the sealing resin (underfill UF) for sealing the space between the through wiring board THWB and the semiconductor chip CHP2, and therefore, such a potential that the cracks occurs in the sealing resin can be reduced. Therefore, according to the present embodiment, the reliability of the semiconductor device can be improved also in the viewpoint.

As described above, the advantage obtained by using the through wiring board THWB has been explained. However, the through wiring board THWB has not only the above-described advantage but also a disadvantage. The disadvantage will be also explained below, and devisal for overcoming the disadvantage of the through wiring board THWB in the present embodiment will be explained. First, in the build-up wiring board BPWB, since the conductor film is filled inside the fine via VA as illustrated in, for example, FIG. 3, the terminal TE can be formed even on the fine via VA. Therefore, in the build-up wiring board BPWB, for example, the restriction of the formation of the wiring is less so that the terminal TE can be arranged on the fine via VA, and therefore, the fine-pitched wiring is easily formed.

On the other hand, as illustrated in, for example, FIG. 6, the through wiring board THWB is formed of only the core layer CRL, and the through-holes TH1, TH2, and TH3 penetrating through the core layer CRL are formed therein. In other words, in the through wiring board THWB according to the present embodiment, although the through-holes TH1, TH2, and TH3 penetrating through the front surface to the back surface are formed, there is such a restriction that the terminals TE1 and TE2 cannot be arranged on these through-holes TH1, TH2, and TH3. A reason for this will be explained. Each diameter of the through-holes TH1, TH2, and TH3 formed in the through wiring board THWB is, for example, about 150 μm which is larger than the diameter (about 50 μm) of the fine via. From a viewpoint, even if the plate film (conductor film)

is formed in the through-holes TH1, TH2, and TH3, the plate film is formed on only each inner wall thereof whereas the plate film is not filled inside the through-holes TH1, TH2, and TH3 so that the through-holes TH1, TH2, and TH3 have a hollow state.

Figure 8:
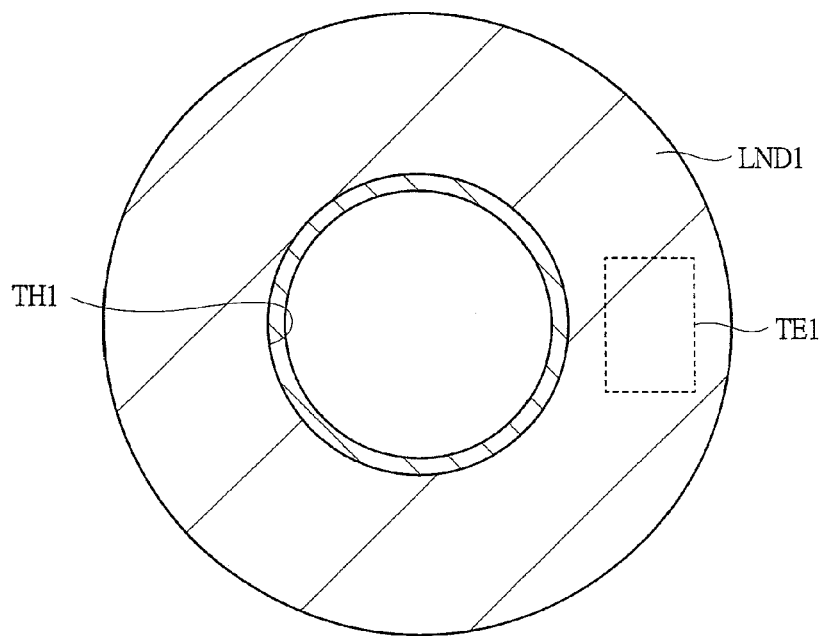
FIG. 8 is a view illustrating a configuration example in which a terminal is arranged on a through-hole.

With exemplifying the through-hole TH1 among the through-holes TH1, TH2, and TH3 configured as described above, such a case that the terminal TE1 is arranged on this through-hole TH1 will be considered. FIG. 8 is a view illustrating a configuration example in which the terminal TE1 is arranged on the through-hole TH1. As illustrated in FIG. 8, a land LND1 is formed so as to surround an upper surface of a hollow through-hole TH1. A diameter of the land LND1 is about 250 μm. That is, since the through-hole TH1 is hollow, the plate film formed on a side surface of the through-hole TH1 and the land LND1 are electrically connected to each other by forming the land LND1 so as to surround the upper surface of the through-hole TH1. And, it is considered that the terminal TE1 can be arranged on the through-hole TH1 via the land LND1 by forming the terminal TE1 on the land LND1.

Figure 9:
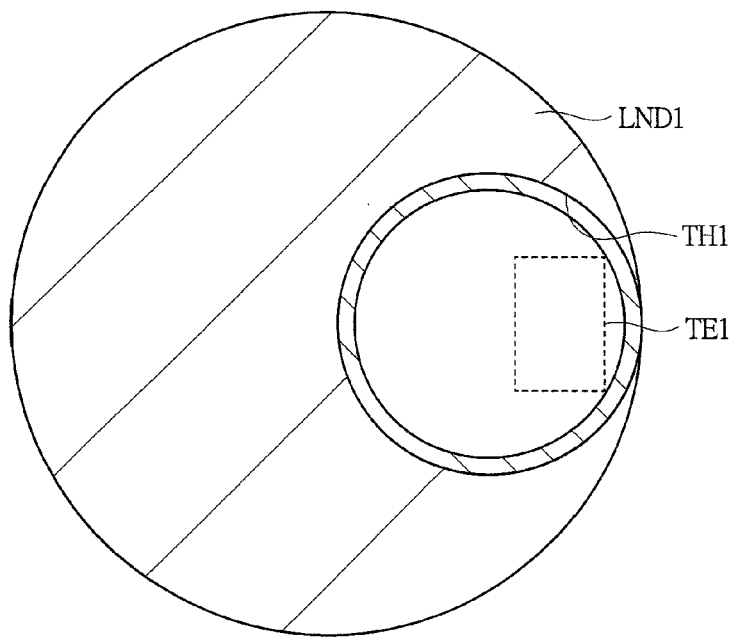
FIG. 9 is a view illustrating a configuration example in a case that a positional relation between a through-hole and a land is shifted.

However, practically, as illustrated in FIG. 9, patterning accuracy in the formation of the through-hole TH1 and the land LND1 is not high, and therefore, such a case that a position of the land LND1 and a position of the through-hole TH1 are shifted from each other is considered. In this case, the terminal TE1 is arranged on not the land LND1 but the hollow through-hole TH1. Accordingly, since the through-hole TH1 is in a hollow state, the terminal TE1 and the through-hole TH1 are not electrically connected to each other. As described above, when the terminal TE1 is arranged on the through-hole TH1, connection failure between the through-hole TH1 and the terminal TE1 tends to occur due to the hollow state of the inside of the through-hole TH1 formed in the through wiring board THWB because of the large diameter thereof and due to the shift of the positional relationship between the through-hole TH1 and the land LND1 because of the problem of the patterning accuracy.

Here, it is considered that a plugging resin is embedded inside the through-hole TH as similar to the through-hole TH formed in the build-up wiring board BPWB illustrated in FIG. 3. That is, in the build-up wiring board BPWB, the plugging resin is embedded inside the through-hole TH having the large diameter. And, a cover plating film is formed on the through-hole TH into which the plugging resin has been embedded, and the via VA and the wiring are formed on this cover plating film. As described above, in the build-up wiring board BPWB, the via VA and the wiring can be arranged on the through-hole TH having the large diameter. As a result, the restriction in the formation of the wiring can be reduced.

However, as different from the above-described build-up wiring board BPWB illustrated in FIG. 3, the through wiring board THWB (see FIG. 6) according to the present embodiment is not structured such that the plugging resin is embedded inside the through-hole TH having the large diameter. This is because the usage of the plugging resin increases a cost due to such that the plugging resin is newly required and that time and effort for embedding the plugging resin inside the through-hole TH are put. Therefore, the through wiring board THWB is structured such that the through-holes TH1, TH2, and TH3 are filled with a solder resist SR which has been applied to the front surface and the back surface of the through wiring board THWB. In other words, the solder resist SR (first solder resist) which has been applied to the front surface of the through wiring board THWB and the solder resist SR (second solder resist) which has been applied to the back surface of the through wiring board THWB are connected to each other through the solder resist SR which has been filled inside the through-hole (TH1, TH2, and TH3). Note that all of the solder resist SR (first solder resist) which has been applied to the front surface of the through wiring board THWB, the solder resist SR (second solder resist) which has been applied to the back surface of the through wiring board THWB, and the solder resist SR which has been filled inside the through-holes (TH1, TH2, and TH3) are made of the same material. This point is one of some different points between the structure of the through wiring board THWB and the structure of the build-up wiring board BPWB.

Also in the through wiring board THWB according to the present embodiment, by adopting the configuration in which the plugging resin is embedded inside the through-hole TH1 so as to form the cover plating film, the through-hole TH1 and the terminal TE can be electrically connected to each other reliably even if the terminal TE1 is formed on the through-hole TH1. However, such a configuration increases the cost of the through wiring board THWB, and therefore, the through wiring board THWB according to the present embodiment the above-described configuration does not have the above-described configuration. Therefore, in the through wiring board THWB according to the present embodiment, such a problem that the terminal TE1 cannot be arranged on the through-hole TH1 is exposed. Accordingly, in the present embodiment, while such a restriction that the terminal TE1 cannot be arranged on the through-hole TH1 is assumed, devisal for achieving a wiring layout on the through wiring board THWB as efficient as possible and suppressing the cost increase is adopted. This devisal point is a second feature point in the present embodiment. The second feature point will be explained below with reference to the drawings.

First, the second feature point in the present embodiment is that, for example, the wiring layout is devised while a formation area for the through-hole TH1, a formation area for the through-hole TH2, and a formation area for the terminal TE1 are individually separated from each other as illustrated in FIG. 6. More specifically, as illustrated in FIG. 6, a plurality of through-holes TH2 are provided in the area AR0 of the through wiring board THWB, and a plurality of terminals TE1 are provided in the area AR1 of the through wiring board THWB. And, a plurality of through-holes TH1 are provided in the area AR2 of the through wiring board THWB. By adopting such a configuration, the through-holes TH1 and TH2 and the terminal TE1 can be formed in the through wiring board THWB without arranging the terminal TE1 on the through-hole TH1 and the through-hole TH2.

Further, the devised wiring layout configuration will be explained with reference to FIG. 7. In FIG. 7, the terminals TE1 are formed in two rows in the area AR1 of the through wiring board THWB. And, a plurality of through-holes TH2 are arranged in the area AR0 which is the area outer than the area AR1. Meanwhile, a plurality of through-holes TH1 are arranged in the area AR2 which is the area inner than the area AR1. At this time, among the terminals TE1 formed in two rows in the area AR1, the terminal TE1 arranged in an outer row is electrically connected to the through-hole TH2 arranged in the area AR0. On the other hand, among the terminals TE1 formed in two rows in the area AR1, the terminal TE1 arranged in an inner row is electrically connected to the through-hole TH1 arranged in the area AR2. As described above, in the present embodiment, the terminal TE1 electrically connected to the through-hole TH2 formed in the area AR0 is arranged close to the area AR0, and the terminal TE1 electrically connected to the through-hole TH1 formed in the area AR2 is arranged close to the area AR2. By adopting such a configuration, the connection between the through-hole TH1 and the terminal TE1 and the connection between the through-hole TH2 and the terminal TE2 can be achieved efficiently while the formation area for the through-hole TH1, the formation area for the through-hole TH2, and the formation area for the terminal TE1 are individually separated from each other.

For example, when the through-hole TH2 formed in the area AR0 and the terminal TE1 arranged in the row close to the area AR2 are connected to each other or when the through-hole TH1 formed in the area AR2 and the terminal TE1 arranged in the row close to the area AR0 are connected to each other, leading of the wiring formed in the area AR1 is complicated, and it is difficult to configure the efficient wiring layout.

On the other hand, in the present embodiment, as illustrated in FIG. 7, the terminals TE1 electrically connected to the through-holes TH2 formed in the area AR0 are arranged on the side close to the area AR0 and the terminals TE1 electrically connected to the through-holes TH1 formed in the area AR2 are arranged on the side close to the area AR2.

In other words, in the area AR1, the terminal TE1 electrically connected to the through-hole TH2 is arranged so as to be closer to the area AR0 than the area AR2, the terminal TE1 electrically connected to the through-hole TH1 is arranged so as to be closer to the area AR2 than the area AR0, and the terminals TE1 are electrically connected to the through-holes TH1 and TH2 through wirings WIRE1 and WIRE2, respectively. That is, such a wiring as connecting the area AR0 and the area AR2 across the area AR1 and as passing through between the respective terminals TE1 does not exist. According to the present embodiment, by adopting such a wire connection, the leading of the wiring inside the area AR1 is not required, so that the connection between the through-hole TH1 and the terminal TE1 and the connection between the through-hole TH2 and the terminal TE2 can be efficiently achieved while the formation area for the through-hole TH1, the formation area for the through-hole TH2, and the formation area for the terminal TE1 are individually separated from each other. The through wiring board THWB is structured to have only one wiring layer on each of the front surface and the back surface of the core layer CRL, and cannot achieve higher wiring density than that of the structure in which a plurality of wiring layers can be achieved by providing a plurality of build-up layers (a plurality of layers of BPL1 and a plurality of layers of BPL2) on each of the front surface and the back surface of the core layer CRL in the build-up wiring board BPWB. Therefore, in the through wiring board THWB, the above-described feature of the wiring leading is important to achieve the high wiring density as equivalent as that of the build-up wiring board BPWB.

Further, as illustrated in FIG. 7, the present embodiment also has a feature point that the through-hole TH1 and the through-hole TH2 are formed separately in the area AR0 which is the outer area of the area AR1 where the terminal TE1 is formed and the area AR2 which is the inner area of the area AR1. For example, such a case that the through-hole TH2 is formed in only the area AR0 which is the outer area of the area AR1 where the terminal TE1 is formed is considered. In this case, since the through-hole TH2 is formed in only the area AR0, the number of the through-holes TH2 formed in the area AR0 is increased. Therefore, the number of wirings for electrically connecting between the plurality of through-holes TH2 formed in the area AR0 and the plurality of terminals TE1 formed in the area AR1, respectively, is also increased. As a result, it is required to achieve the fine-pitched wiring laid from the area AR0 to the area AR1.

However, in the present embodiment, instead of the build-up wiring board which is suitable for the fine pitching, the through wiring board THWB which is more difficult to achieve the fine pitching than the build-up wiring board is used. Therefore, in the through wiring board THWB, it is understood that it is difficult to achieve the layout configuration where the through-holes TH2 are collectively arranged in only the area AR0 as described above.

Accordingly, in the present embodiment, instead of collectively arranging the through-holes TH2 in only the area AR0, such devisal that the through-hole TH1 and the through-hole TH2 are arranged separately in the area AR0 and the area AR2 which sandwich the area AR1 where the terminal TE1 is formed is adopted. In this manner, since the through-hole TH1 and the through-hole TH2 are arranged separately in the area AR0 and the area AR2, the wiring WIRE1 for connecting between the through-hole TH1 and the terminal TE1 and the wiring WIRE2 for connecting between the through-hole TH2 and the terminal TE1 are not densely arranged but can be dispersed in different areas from each other. As a result, even if the through wiring board THWB which is difficult to achieve the fine pitching is used, the increases in the number of through-holes TH1 (TH2) and the number of the terminals TE1 caused by high functionality of the semiconductor device can be supported. Also from this viewpoint, it is understood that the efficient wiring layout is achieved according to the present embodiment.

Here, as illustrated in FIG. 7, an area size of the area AR0 is larger than an area size of the area AR2, and therefore, the number of through-holes TH2 formed in the area AR0 is larger than the number of through-holes TH1 formed in the area AR2. Therefore, the number of terminals TE1 electrically connected to the through-holes TH2 formed in the area AR0 is also larger than the number of terminals TE1 electrically connected to the through-holes TH1 formed in the area AR2. From this fact, among the terminals TE1 formed in two rows in the area AR1, it can be said that the number of the terminals TE1 arranged so as to be closer to the area AR0 is larger than the number of terminals TE1 arranged so as to be closer to the area AR2. And, the wirings for connecting between the through-holes TH2 formed in the area AR0 and the terminals TE1 formed in the area AR1 include, for example, a power supply line for supplying a power supply potential, a GND line for supplying a reference potential (GND potential), and a signal line for transmitting a signal (signal voltage). Similarly, wirings for connecting between the through-holes TH1 formed in the area AR2 and the terminals TE1 formed in the area AR1 also include, for example, a power supply line for supplying a power supply potential, a GND line for supplying a reference potential (GND potential), and a signal line for transmitting a signal (signal voltage).

Subsequently, a third feature point according to the present embodiment is that the plurality of through-holes TH3 and the plurality of terminals TE2 are formed in the area AR3 as illustrated in FIG. 6. That is, as also explained in the second feature point, a basic technical idea according to the present embodiment is that the through-hole TH1 and the terminal TE1 are efficiently connected to each other and the through-hole TH2 and the terminal TE2 are efficiently connected to each other while the formation area for the through-hole TH1, the formation area for the through-hole TE2, and the formation area for the terminal TE1 are individually separated from each other. However, the present embodiment also has such a feature that the plurality of through-holes TH3 and the plurality of terminals TE2 are formed in the area AR3 as a further third feature point.

More specifically, in the area AR3 as illustrated in FIG. 7, while the plurality of through-holes TH3 and the plurality of terminals TE2 are formed, the terminal TE2 is not arranged on the through-hole TH3. That is, as illustrated in FIG. 7, while the land LND3 is formed so as to surround the through-hole TH3, the terminal TE2 is not arranged on the land LND3, and the land LND3 and the terminal TE2 are connected to each other through the wiring WIRE3. The wirings WIRE3 for connecting between the through-holes TH3 and the terminals TE2 formed in the area AR3 include, for example, only the power supply line for supplying the power supply potential and the GND line for supplying the reference potential (GND potential). That is, the wirings WIRE3 for connecting between the through-holes TH3 and the terminals TE2 formed in the area AR3 do not include the signal line for transmitting the signal (signal voltage).

In this manner, according to the present embodiment, the power supply potential and the reference potential can be supplied not only from some of the terminals TE1 formed in the area AR1 to the semiconductor chip CHP2 but also from the terminals TE2 formed in the area AR3 to the semiconductor chip CHP2. That is, the power supply potential and the reference potential can be supplied from not only the area AR1 of the semiconductor chip CHP2 but also the area AR3 to the semiconductor chip CHP2, and therefore, a power supply drop (IR drop) inside the semiconductor chip CHP2 can be reduced.

For example, when the through-holes TH3 and the terminals TE2 forming the power supply wiring and the reference wiring are not formed in the area AR3, the power supply potential and the reference potential can be supplied from only the terminals TE1 formed in the area AR1 into the semiconductor chip CHP2. In this case, in order to supply the power supply potential and the reference potential to an integrated circuit formed in the area AR3 of the semiconductor chip CHP2, it is required to lead an internal wiring of the semiconductor chip CHP2 from the area AR1 of the semiconductor chip CHP2 to the area AR3. At this time, decrease in the power supply potential (the power supply drop) is caused by a resistance component due to the leading of the internal wiring.

On the other hand, in the present embodiment, the through-hole TH3 and the terminal TE2 configuring the power supply wiring and the reference wiring are formed in the area AR3 of the through wiring board THWB so that the power supply potential and the reference potential are supplied from the terminal TE2 to the area AR3 of the semiconductor chip CHP2. Therefore, according to the present embodiment, the power supply potential and the reference potential are supplied not only from some of the terminals TE1 formed in the area AR1 to the semiconductor chip CHP2 but also from the terminals TE2 formed in the area AR3 to the semiconductor chip CHP2. That is, since the power supply potential and the reference potential can be supplied from not only the area AR1 of the semiconductor chip CHP2 but also the area AR3, the power supply drop (IR drop) inside the semiconductor chip CHP2 can be reduced.

Note that the power supply potential and the reference potential supplied from some of the plurality of terminals TE1 formed in the area AR1 can be supplied to an I/O circuit (external interface circuit) formed in the semiconductor chip CHP2. On the other hand, the power supply potential and the reference potential supplied from some of the plurality of terminals TE2 formed in the area AR3 can be provided to a core circuit (internal circuit) formed in the semiconductor chip CHP2. That is, it is desired that the power supply potential and the reference potential are supplied from the plurality of terminals TE1 formed in the area AR1 to the I/O circuit, and that the power supply potential and the reference potential are supplied from the plurality of terminals TE2 formed in the area AR3 to the core circuit driven at a lower voltage than that of the I/O circuit. In other words, in the power supply potential supplied from the plurality of terminals TE1 formed in the area AR1, a higher potential than the power supply potential supplied from the plurality of terminals TE2 formed in the area AR3 is supplied.

By adopting such a configuration, for example, the pillar-shaped bump electrode PLBMP1 of the semiconductor chip CHP2 to which the terminal TE1 is connected is a bump electrode including an input/output signal pin, and therefore, supplies the power supply potential and the reference potential for the I/O circuit to the terminal TE1, so that the electrode can efficiently supply the power supply potential and the reference potential for the I/O circuit with the shortest distance. On the other hand, the pillar-shaped bump electrode PLBMP2 of the semiconductor chip CHP2 to which the terminal TE2 is connected is a bump electrode not including the input/output signal pin, and therefore, supplies the power supply potential and the reference potential for the core circuit for driving the internal circuit (core circuit) arranged at a central portion of the semiconductor chip CHP2, so that the electrode can efficiently supply the power supply potential and the reference potential for the core circuit with the shortest distance.

Further, in the present embodiment, regarding the through-holes TH3 arranged in the area AR3 of the through wiring board THWB, it is desired that the through-holes TH3 for supplying the power supply potential and the through-holes TH3 for supplying the reference potential are alternately arranged. In this case, the power supply potential and the reference potential can be supplied entirely over the area AR3 of the semiconductor chip CHP2. More specifically, the internal circuit (core circuit) is formed in the area AR3 which is the central portion of the semiconductor chip CHP2, and the power supply potential and the reference potential can be uniformly supplied to the core circuit by alternately arranging the through-holes TH3 for supplying the power supply potential and the through-holes TH3 for supplying the reference potential. That is, for example, when the through-holes TH3 for supplying the power supply potential and the through-holes TH3 for supplying the reference potential are arranged in an imbalance state, it is difficult to uniformly supply the power supply potential and the reference potential to the core circuit formed in the area AR3. However, by alternately arranging the through-holes TH3 for supplying the power supply potential and the through-holes TH3 for supplying the reference potential, the power supply potential and the reference potential can be uniformly supplied to the core circuit, and, as a result, operation stability of the core circuit can be improved.

The above description indicates that the through wiring board THWB according to the present embodiment has the second feature point and third feature point described above so that the terminals TE1 are formed in the area AR1 of the through wiring board THWB and that the terminals TE2 are formed in the area AR3 of the through wiring board THWB as illustrated in FIG. 6. That is, in the present embodiment, it is not as if the terminals (terminals TE1 and TE2) exist in all of the area AR1, the area AR2, and the area AR3 of the through wiring board THWB on which the semiconductor chip CHP2 is mounted, and therefore, arrangement positions of the bump electrodes formed in the semiconductor chip CHP2 mounted on the through wiring board THWB are also changed. More specifically, the configuration in which the bump electrodes BMP are formed on the whole surface of the semiconductor chip CHP1 having the rectangular shape as illustrated in FIG. 1 is modified to the configuration in which the pillar-shaped bump electrodes PLBMP1 (PLBMP2) are formed in only the area AR1 and the area AR3 of the semiconductor chip CHP2 having the rectangular shape as illustrated in FIG. 4.

A feature of the semiconductor chip CHP2 mounted on the through wiring board THWB according to the present embodiment will be described below. A fourth feature point according to the present embodiment is a bump structure of the semiconductor chip CHP2 mounted on the through wiring board THWB. More specifically, as illustrated in FIG. 4, the semiconductor chip CHP2 according to the present embodiment has the area AR1, the area AR2 positioned inner than the area AR1, and the area AR3 positioned inner than the area AR2. And, while the pillar-shaped bump electrode PLBMP1 is formed in the area AR1 and the pillar-shaped bump electrode PLBMP2 is formed in the area AR2, the pillar-shaped bump electrode PLBMP1 and the pillar-shaped bump electrode PLBMP2 are not formed in the area AR2.

FIG. 6 illustrates a state that the semiconductor chip CHP2 configured as described above is mounted on the through wiring board THWB. As illustrated in FIG. 6, it is understood that the pillar-shaped bump electrode PLBMP1 formed in the area AR1 of the semiconductor chip CHP2 is directly connected to the terminal TE1 formed in the area AR1 of the through wiring board THWB, and that the pillar-shaped bump electrode PLBMP2 formed in the area AR3 of the semiconductor chip CHP2 is directly connected to the terminal TE2 formed in the area AR3 of the through wiring board THWB. That is, a connection portion between the pillar-shaped bump electrode PLBMP1 and the terminal TE1 and a connection portion between the pillar-shaped bump electrode PLBMP2 and the terminal TE2 are arranged so as to separate from each other through the area AR2 of the semiconductor chip CHP2 (through wiring board THWB).

Here, a problem arising when the bump structure of the semiconductor chip CHP1 illustrated in FIG. 1 is modified to the bump structure of the semiconductor chip CHP2 illustrated in FIG. 4 will be explained. For example, it is considered that the bump structure of the semiconductor chip CHP1 illustrated in FIG. 1 is modified to the bump structure of the semiconductor chip CHP2 illustrated in FIG. 4 without changing the number of bump electrodes formed in the semiconductor chip CHP1 illustrated in FIG. 1. In this case, while the bump electrodes BMP are arranged over the whole surface area in the semiconductor chip CHP1 illustrated in FIG. 1, the bump electrodes are arranged in only a part (the area AR1 and the area AR3) of the surface area in the semiconductor chip CHP2 illustrated in FIG. 4. This fact means that an area size in the semiconductor chip CHP2 illustrated in FIG. 4 for arranging the bump electrodes is smaller than an area size in the semiconductor chip CHP1 illustrated in FIG. 1 for arranging the bump electrodes BMP. Therefore, in order to equalize the number of bump electrodes of the semiconductor chip CHP1 illustrated in FIG. 1 to the number of bump electrodes of the semiconductor chip CHP2 illustrated in FIG. 4, it is required to make each size of the bump electrodes of the semiconductor chip CHP2 illustrated in FIG. 4 smaller than each size of the bump electrodes BMP of the semiconductor chip CHP1 illustrated in FIG. 1.

Each of the bump electrodes BMP formed in the semiconductor chip CHP1 illustrated in FIG. 1 is a hemispherical bump electrode BMP made of, for example, solder, and it is first considered that a size of the bump electrode BMP is made small.

Figure 10:
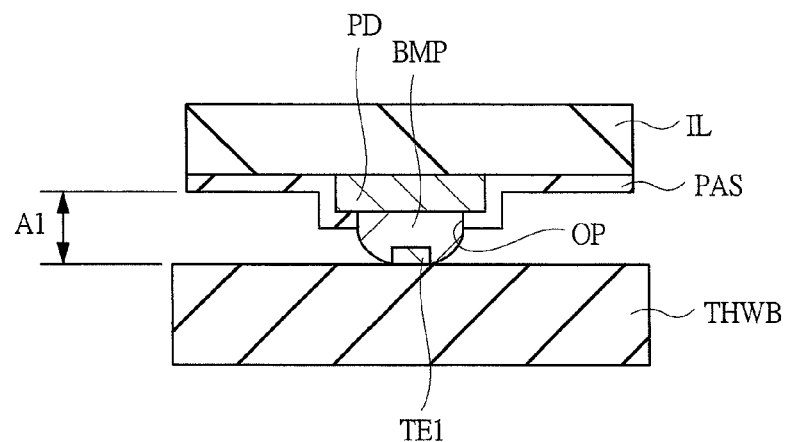
FIG. 10 is a cross-sectional view illustrating a state that a hemispherical bump electrode having a small size and made of solder is mounted on a through wiring board.

FIG. 10 is a cross-sectional view illustrating a state that the size of the hemispherical bump electrode BMP made of solder is made small and the bump electrode BMP is mounted on the through wiring board THWB. As illustrated in FIG. 10, the terminal TE1 is formed on the through wiring board THWB, and the bump electrode BMP is mounted on the terminal TE1. The bump electrode BMP is formed in, for example, an opening OP formed in a passivation film (surface protection film) PAS formed of a silicon nitride film, and the bump electrode BMP is formed on a pad PD exposed from the opening OP. And, the pad PD is formed on an interlayer insulation film IL.

At this time, while the size of the hemispherical bump electrode BMP is made smaller, a space (stand-off) A1 between the semiconductor chip and the through wiring board THWB is also made smaller. When the space (stand-off) A1 between the semiconductor chip and the through wiring board THWB is narrowed as described above, filling property of the underfill filled in the space decreases, which results in a void (bubble) inside the underfill in some cases. When the void occurs inside the underfill, in some cases, moisture enters the void, the moisture inside the void expands due to high-temperature reflow (for example, at about 240 to 260° C.) in solder mounting onto a mounting board, and a crack occurs inside the underfill from the void as a starting point. Further, when the void is positioned adjacent to the bump electrode BMP, there is a risk that a connection portion between the bump electrode BMP and the terminal TE1 corrodes due to the entrance of the moisture into the void, which results in decrease in connection reliability between the semiconductor chip and the through wiring board THWB. That is, only simply decreasing the size of the hemispherical bump electrode BMP formed in the semiconductor chip CHP1 illustrated in FIG. 1 causes the decrease in the reliability of the semiconductor device because the space (stand-off) A1 between the semiconductor chip and the through wiring board THWB is made small.

Figure 11:
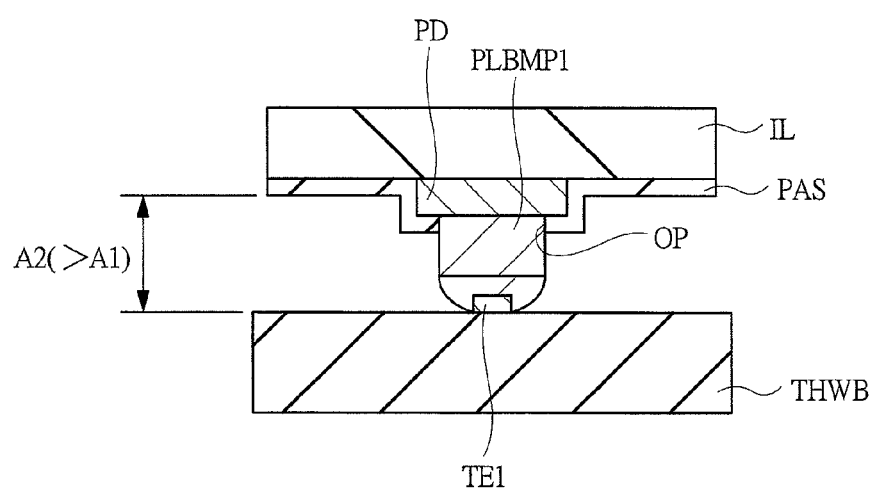
FIG. 11 is a partial cross-sectional view illustrating a state that a pillar-shaped bump electrode is mounted on a through wiring board.

As a result studied by the present inventors, it is required that the space (stand-off) A1 between the semiconductor chip and the through wiring board THWB is about 20 μm or larger in order to secure the filling property of the underfill. Accordingly, in the present embodiment, not the hemispherical bump electrode BMP as illustrated in FIG. 10 but a pillar-shaped bump electrode PLBMP1 as illustrated in FIG. 11 is adopted. FIG. 11 is a partial cross-sectional view illustrating a state that the pillar-shaped bump electrode PLBMP1 is mounted on the through wiring board THWB. As illustrated in FIG. 11, the terminal TE1 is formed on the through wiring board THWB, and the pillar-shaped bump electrode PLBMP1 is mounted on the terminal TE1. The pillar-shaped bump electrode BMP is formed of, for example, a pillar-shaped portion made of copper (Cu) and a connection portion made of solder and formed on the pillar-shaped portion. In other words, it can also be said that the pillar-shaped bump electrode PLBMP1 is formed of a first portion made of solder and a second portion (made of copper) having a higher melting point than that of the first portion (made of solder). For example, the pillar-shaped bump electrode PLBMP1 is formed in the opening OP formed in the passivation film (surface protection film) PAS formed of a silicon nitride film, and the pillar-shaped bump electrode PLBMP1 is formed on the pad PD exposed from the opening OP. And, the pad PD is formed on the interlayer insulation film IL.

In the pillar-shaped bump electrode PLBMP1 configured as described above, even if a size of the pillar-shaped bump electrode PLBMP1 is made small, the space (stand-off) A2 between the semiconductor chip and the through wiring board THWB is not smaller than the space (stand-off) A1 in the connection with the hemispherical bump electrode BMP illustrated in FIG. 10 (A2>A1) because of the pillar-shaped portion made of copper. That is, the pillar-shaped bump electrode BMP is formed of the first portion made of solder and the second portion (made of copper) having the higher melting point than that of the first portion (made of solder). Therefore, when the semiconductor chip is mounted on the through wiring board THWB and the pillar-shaped bump electrode PLBMP1 of the semiconductor chip and the terminal TE1 on the through wiring board THWB are electrically connected by melding the first portion (made of solder) of the pillar-shaped bump electrode PLBMP1 at a high temperature (for example, about 240 to 260° C.), the second portion (made of copper) does not melt at the high temperature since a melting point of the second portion (made of copper) of the pillar-shaped bump electrode PLBMP1 is higher than a melting point of the first portion (made of solder). Therefore, a size of the space (stand-off) A2 between the semiconductor chip and the through wiring board THWB is not smaller than a height of the second portion (made of copper) of the pillar-shaped bump electrode PLBMP1. As described above, in order to secure the filling property of the underfill, it is required that the space (stand-off) A2 between the semiconductor chip and the through wiring board THWB is about 20 μm or larger. However, the height of the second portion (made of copper) of the pillar-shaped bump electrode PLBMP1 is about 30 μm, and therefore, satisfies the condition.

As a result, when the pillar-shaped bump electrode PLBMP1 as illustrated in FIG. 11 is used, the stand-off can be secured even if the size of the pillar-shaped bump electrode PLBMP1 itself is made small, and therefore, the reduction of the filling property of the underfill and the reduction of the connection reliability between the semiconductor chip and the through wiring board THWB can be suppressed. From this result, in the semiconductor chip CHP2 according to the present embodiment, the pillar-shaped bump electrode PLBMP1 and the pillar-shaped bump electrode PLBMP2 are used as illustrated in, for example, FIGS. 5 and 6.

Note that the case that the second portion of the pillar-shaped bump electrode PLBMP1 is made of copper has been exemplified here for the explanation. However, there is no problem for any material as long as the (metal) material has a higher melting point than that of the solder of the first potion. For the second portion, gold (Au) or others may be used as the material in addition to copper. When the second portion is made of copper, cost (material cost) can be suppressed lower than the usage of gold. Also, the second portion of the pillar-shaped bump electrode PLBMP1 can be easily highly formed by stacking formation by a plating method.

Further, as the solder of the first portion of the pillar-shaped bump electrode PLBMP1, a Sn—Ag based or Sn—Ag—Cu based lead-free solder may be used.

From the above description, it can be said that the fourth feature point according to the present embodiment is that the pillar-shaped bump electrodes PLBMP1 (PLBMP2) are formed in only a part (the area AR1 and the area AR3) of the surface area of the semiconductor chip CHP2 as illustrated in, for example, FIG. 4. In this manner, the semiconductor chip CHP2 supported for the through wiring board THWB having the second feature point and the third feature point can be configured. And, by mounting the semiconductor chip CHP2 having the fourth feature point on the through wiring board THWB having the second feature point and the third feature point, the reliability of the semiconductor device can be improved, and the cost thereof can be reduced.

Further, in the semiconductor chip CHP2 according to the present embodiment, the following effect can be also obtained by providing the above-described fourth feature point. That is, in the semiconductor chip CHP2 according to the present embodiment, the pillar-shaped bump electrode PLBMP1 is formed in the area AR1, and the pillar-shaped bump electrode PLBMP2 is formed in the area AR3 sandwiching the area AR2 with the area AR1 as illustrated in, for example, FIG. 4. This fact means that the pillar-shaped bump electrode PLBMP1 formed in the area AR1 and the pillar-shaped bump electrode PLBMP2 formed in the area AR3 are formed so as to be separated from each other by a space corresponding to the area AR2 formed between the area AR1 and the area AR3. Here, the pillar-shaped bump electrode PLBMP2 formed in the area AR3 is connected to the power supply lines and has a function of supplying the power supply potential or the reference potential to the integrated circuit formed inside the semiconductor chip CHP2. On the other hand, the pillar-shaped bump electrodes PLBMP1 formed in the area AR1 are connected to not only the power supply line but also the signal line. Therefore, when the pillar-shaped bump electrode PLBMP1 formed in the area AR1 is arranged adjacent to the pillar-shaped bump electrode PLBMP2 formed in the area AR3, mutual interference (cross coupling) between the pillar-shaped bump electrode PLBMP1 and the pillar-shaped bump electrode PLBMP2 tends to occur, and therefore, noise tends to occur in the power supply voltage and the reference voltage supplied to the pillar-shaped bump electrode PLBMP2 connected to the power supply line. On the other hand, in the semiconductor chip CHP2 according to the present embodiment, the area AR2 where the bump electrode is not formed exists between the area AR1 and the area AR3, so that a distance between the pillar-shaped bump electrode PLBMP2 formed in the area AR3 and the pillar-shaped bump electrode PLBMP1 formed in the area AR1 can be increased by this area AR2. This fact means that the cross coupling between the power supply line and the signal line can be suppressed in the semiconductor chip CHP2 according to the present embodiment, the power supply line being connected to the pillar-shaped bump electrode PLBMP2 formed in the area AR3, and the signal line being connected to the pillar-shaped bump electrode PLBMP1 formed in the area AR1. As a result, according to the present embodiment, stability of the power supply voltage or the reference voltage applied to the power supply line connected to the pillar-shaped bump electrode PLBMP2 formed in the area AR3 can be enhanced, so that operation reliability of the integrated circuit formed in the semiconductor chip CHP2 can be improved.

Subsequently, a fifth feature point in the present embodiment will be explained. The fifth feature point in the present embodiment relates to a structure of the semiconductor chip. More specifically, the fifth feature point in the present embodiment is that the semiconductor chip CHP1 studied by the present inventors has a so-called rewiring structure whereas the semiconductor chip CHP2 in the present embodiment illustrated in FIG. 4 does not have the rewiring structure. In this manner, in the semiconductor device according to the present embodiment, it is not required to form the rewiring structure in the semiconductor chip, and therefore, an advantage of simplified designing of the semiconductor chip can be obtained.

Figure 12:
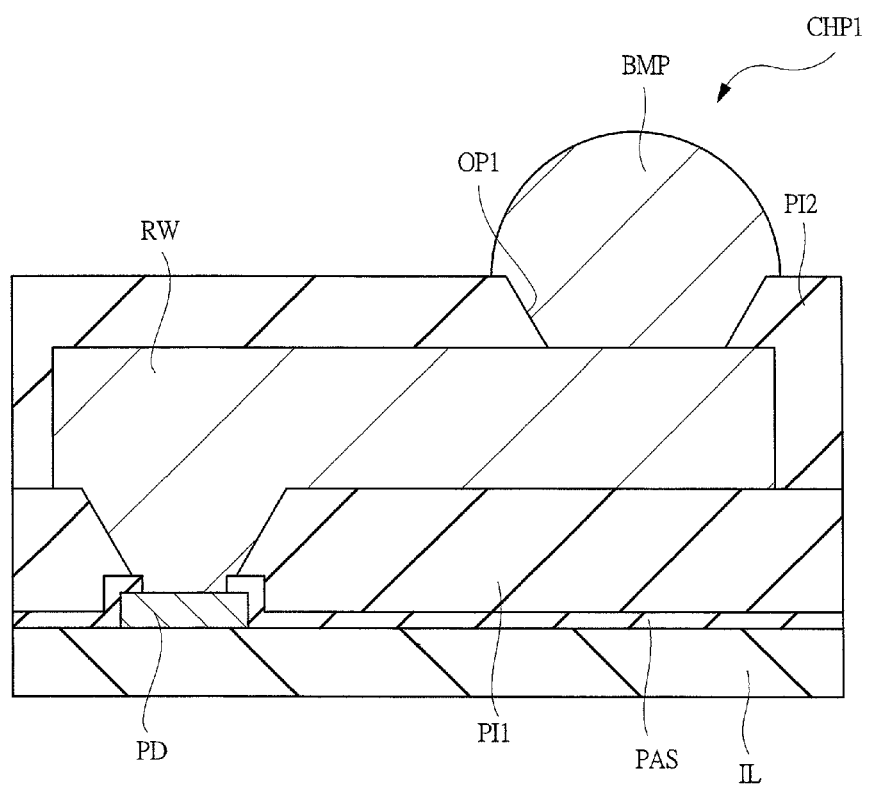
FIG. 12 is a cross-sectional view illustrating a rewiring structure formed in a semiconductor chip studied by the present inventors.

For example, in the semiconductor chip CHP1 illustrated in FIG. 1 studied by the present inventors, it is required to form the bump electrodes BMP over the whole surface area, and therefore, the so-called rewiring structure is required. The rewiring structure will be explained below. FIG. 12 is a cross-sectional view illustrating the rewiring structure formed in the semiconductor chip CHP1. As illustrated in FIG. 12, in the semiconductor chip CHP1, a pad PD is formed on an interlayer insulation film IL which is the uppermost layer, and a passivation film PAS formed of, for example, a silicon nitride film is formed so as to cover the pad PD. And, an opening is formed in the passivation film PAS, and the pad PD is exposed from the opening. Further, a resin film PI1 formed of, for example, a polyimide resin film is formed on the passivation film PAS, and an opening is also formed in the resin film PI1. And, a rewiring RW is formed to be electrically connected to the pad PD and to extend on the resin film PI1. Next, a resin film PI2 formed of, for example, a polyimide resin film is formed so as to cover the rewiring RW, and an opening OP1 is formed in the resin film PI2. And, a bump electrode BMP is formed on the rewiring RW exposed from the opening OP1. In the above-described manner, the rewiring structure is formed in the semiconductor chip illustrated in FIG. 1 studied by the present inventors. In the semiconductor chip CHP1 formed with the rewiring structure in this manner, it is required to design a layout of the rewiring RW for connecting the pad PD and the bump electrode BMP, and therefore, the designing of the semiconductor chip CHP1 is complicated. Further, insertion of the rewiring RW between the pad PD and the bump electrode BMP adds a wiring resistance or inductance to a transmission route so as to affect a high-speed operation of the semiconductor device.

Figure 13:
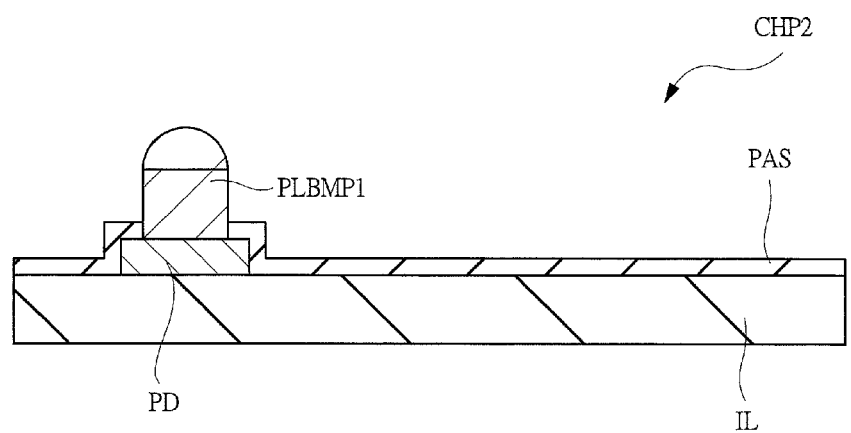
FIG. 13 is a cross-sectional view illustrating a bump structure formed in a semiconductor chip studied by the present inventors.

On the other hand, in the semiconductor chip CHP2 illustrated in FIG. 4 according to the present embodiment, it is not required to form the pillar-shaped bump electrodes PLBMP1 (PLBMP2) over the whole surface of the semiconductor chip CHP2, and it is only required to form the pillar-shaped bump electrodes PLBMP1 (PLBMP2) in the area AR1 and the area AR3, and therefore, it is not required to use the rewiring structure. FIG. 13 is a cross-sectional view illustrating a bump structure formed in the semiconductor chip CHP2. As illustrated in FIG. 13, in the semiconductor chip CHP2, the pad PD is formed on the interlayer insulation film which is the uppermost layer, and a passivation film PAS formed of, for example, a silicon nitride film is formed so as to cover the pad PD. Further, an opening is formed in the passivation film PAS, and the pad PD is exposed from the opening. And, a pillar-shaped bump electrode PLBMP1 is directly formed on the pad PD. As described above, according to the semiconductor chip CHP2 in the present embodiment, it is understood that the rewiring is not formed on an upper portion of the pad PD. In other words, in the semiconductor chip CHP2 according to the present embodiment, it can be said that the fifth feature point of the present embodiment is that the rewiring is not formed on an upper portion of the passivation film (surface protection film) PAS (or a polyimide resin film obtained when the polyimide resin film is formed on the passivation film PAS). As described above, according to the present embodiment, since it is not required to form the rewiring structure in the semiconductor chip, the advantage of the simplified designing of the semiconductor chip can be obtained. Further, since the rewiring RW is not formed, the wiring resistance or inductance of the transmission route can be reduced lower than that of the above-described rewiring structure, and, as a result, the high-speed operation of the semiconductor device can be achieved.

Next, a sixth feature point in the present embodiment will be explained. For example, as illustrated in FIGS. 6 and 7, in the semiconductor device according to the present embodiment, the plurality of through-holes TH1 and the plurality of through-holes TH3 are formed in the area AR2 and the area AR3 of the through wiring board THWB. This fact means that, when the semiconductor chip CHP2 is mounted on the through wiring board THWB, many through-holes TH1 and through-holes TH3 exist in the areas (the area AR2 and the area AR3) of the through wiring board THWB overlapping with the semiconductor chip CHP2 in a plane. And, a plating film made of, for example, copper excellent in thermal conductivity is formed on inner walls of the through-holes TH1 and the through-holes TH3, and therefore, heat generated in the semiconductor chip CHP2 can be diffused efficiently from many through-holes TH1 and through-holes TH3 formed just below the semiconductor chip CHP2. Therefore, in the semiconductor device according to the present embodiment, heat release property of the heat generated in the semiconductor chip CHP2 can be improved. As a result, the heat sink HS illustrated in FIG. 2 can be unnecessary in some cases. When the heat sink HS is unnecessary, the material cost can be reduced correspondingly. As described above, the present embodiment has at least the first feature point to the sixth feature point, and the first feature point to the sixth feature point are summarized as follows.

(1) The first feature point in the present embodiment is that not the build-up wiring board BPWB as illustrated in FIG. 3 but the through wiring board THWB as illustrated in FIG. 6 is used as the wiring board on which the semiconductor chip CHP2 is mounted. In this manner, in the present embodiment, it is not required to consider the difference in the thermal expansion coefficient between the build-up layers BPL1 (BPL2) and the core layer CRL because the through wiring board THWB formed of only the core layer CRL is used, and it is not required to consider the electric disconnection of fine via VA formed in the build-up layer BPL1 (BPL2) because there is no build-up layer BPL1 (BPL2). As a result, according to the present embodiment, the reliability of the semiconductor device can be improved while the cost is reduced.

(2) The second feature point in the present embodiment is that, for example, the wiring layout is devised while the formation area for the through-hole TH1, the formation area for the through-hole TH2, and the formation area for the terminal TE1 are individually separated from each other as illustrated in FIG. 6. More specifically, as illustrated in FIG. 6, the plurality of through-holes TH2 are provided in the area AR0 of the through wiring board THWB, and the plurality of terminals TE1 are provided in the area AR1 of the through wiring board THWB. And, the plurality of through-holes TH1 are provided in the area AR2 of the through wiring board THWB. And, in the present embodiment, as illustrated in FIG. 7, the terminal TE1 electrically connected to the through-hole TH2 formed in the area AR0 is arranged close to the area AR0, and the terminal TE1 electrically connected to the through-hole TH1 formed in the area AR2 is arranged close to the area AR2. In this manner, according to the present embodiment, the wire leading inside the area AR1 is unnecessary, and therefore, the connection between the through-hole TH1 and the terminal TE1 and the connection between the through-hole TH2 and the terminal TE2 can be achieved efficiently while the formation area for the through-hole TH1, the formation area for the through-hole TH2, and the formation area for the terminal TE1 are individually separated from each other.

(3) The third feature point in the present embodiment is that the plurality of through-holes TH3 and the plurality of terminals TE2 are formed in the area AR3 as illustrated in FIG. 6, and the wirings for connecting between the through-holes TH3 and the terminals TE2 formed in the area AR3 include, for example, only the power supply line for supplying the power supply potential and the GND line for supplying the reference potential (GND potential). In this manner, according to the present embodiment, the power supply potential and the reference potential can be supplied not only from some of the terminals TE1 formed in the area AR1 to the semiconductor chip CHP2 but also from the terminals TE2 formed in the area AR3 to the semiconductor chip CHP2. That is, the power supply potential and the reference potential can be supplied from not only the area AR1 of the semiconductor chip CHP2 but also the area AR3, and therefore, the power supply drop (IR drop) inside the semiconductor chip CHP2 can be reduced.

(4) The fourth feature point in the present embodiment is that, for example, the pillar-shaped bump electrodes PLBMP1 (PLBMP2) are formed in only a part (the area AR1 and the area AR3) of the surface area of the semiconductor chip CHP2 as illustrated in FIG. 4. In this manner, the stand-off can be secured even if each size of the pillar-shaped bump electrode PLBMP1 (PLBMP2) itself is made small, and therefore, the reduction of the filling property of the underfill and the reduction of the connection reliability between the semiconductor chip and the through wiring board THWB can be suppressed. Further, the semiconductor chip CHP2 supported for the through wiring board THWB having the second feature point and the third feature point can be configured. Still further, according to the fourth feature point in the present embodiment, the area AR2 where the bump electrode is not formed exists between the area AR1 and the area AR3, so that a distance between the pillar-shaped bump electrode PLBMP2 formed in the area AR3 and the pillar-shaped bump electrode PLBMP1 formed in the area AR1 can be increased by this area AR2. As a result, according to the present embodiment, cross coupling between the power supply line and the signal line can be suppressed, the power supply line being connected to the pillar-shaped bump electrode PLBMP2 formed in the area AR3, and the signal line being connected to the pillar-shaped bump electrode PLBMP1 formed in the area AR1. Therefore, according to the present embodiment, stability of the power supply voltage or the referential voltage applied to the power supply line connected to the pillar-shaped bump electrode PLBMP2 formed in the area AR3 can be enhanced, so that operation reliability of the integrated circuit formed in the semiconductor chip CHP2 can be improved.

(5) The fifth feature point in the present embodiment is that, for example, the semiconductor chip CHP2 illustrated in FIG. 4 according to the present embodiment does not have the rewiring structure. In this manner, in the semiconductor device according to the present embodiment, the rewiring structure is not formed in the semiconductor chip, and therefore, the advantage of the simplified designing of the semiconductor chip can be obtained.

(6) The sixth feature point in the present embodiment is that, when the semiconductor chip CHP2 is mounted on the through wiring board THWB, many through-holes TH1 and through-holes TH3 exist in the areas (the area AR2 and the area AR3) of the through wiring board THWB overlapping with the semiconductor chip CHP2 in a plane. In this manner, according to the semiconductor device in the present embodiment, heat release property of the heat generated in the semiconductor chip CHP2 can be improved.

Method of Manufacturing Semiconductor Device in Embodiment

The semiconductor device in the present embodiment is configured as described above, and one example of a manufacturing method thereof will be explained below with reference to the drawings.

Figure 14:
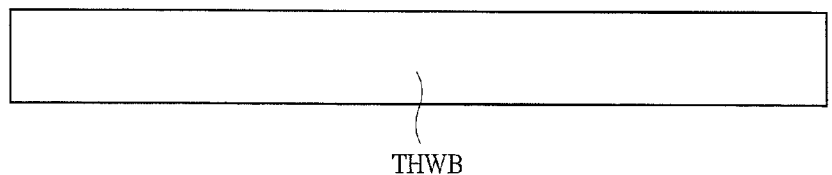
FIG. 14 is a side view illustrating a step of manufacturing the semiconductor device according to the embodiment.

First, as illustrated in FIG. 14, the through wiring board THWB in the present embodiment is prepared. The through wiring board THWB has such a layout configuration as illustrated in, for example, FIG. 4, in which the terminals TE1, TE2, the through-holes TH1 and TH2, and others are formed.

Figure 15:
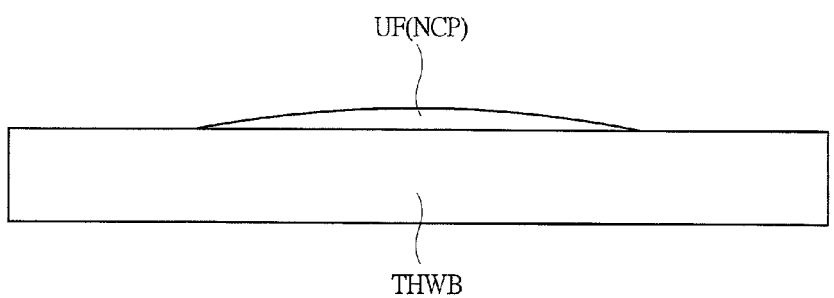
FIG. 15 is a side view illustrating a step of manufacturing the semiconductor device continued from FIG. 14.

And, as illustrated in FIG. 15, the underfill UF is applied onto the chip-mounting area on the front surface of the through wiring board THWB. Note that, as the underfill UF used here, a rapid curing resin NCP (Non-Conductive Paste) may be used.

Figure 16:
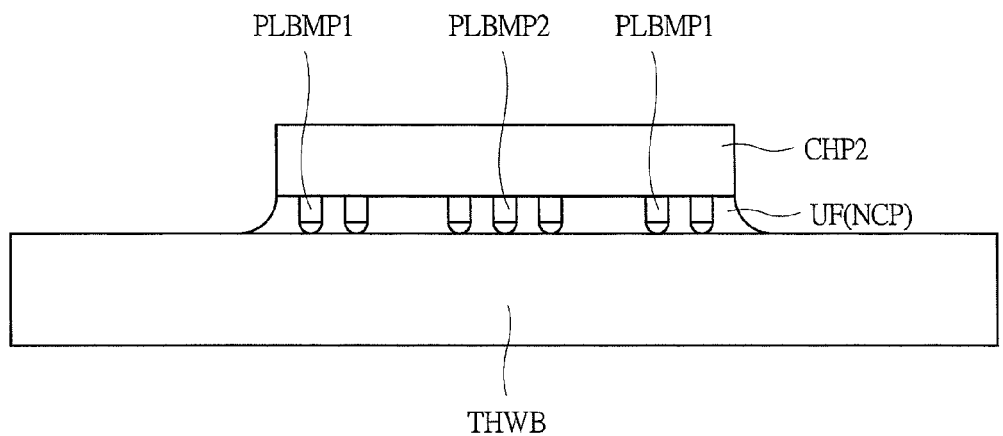
FIG. 16 is a side view illustrating a step of manufacturing the semiconductor device continued from FIG. 15.

Then, as illustrated in FIG. 16, the semiconductor chip CHP2 is mounted on the through wiring board THWB. For example, the pillar-shaped bump electrode PLBMP1 and the pillar-shaped bump electrode PLBMP2 as illustrated in FIG. 4 have been formed on a surface (main surface) of the semiconductor chip CHP2 to be mounted at this time. And, the semiconductor chip CHP2 is mounted on the through wiring board THWB so that the pillar-shaped bump electrodes PLBMP1 (PLBMP2) formed on the semiconductor chip CHP2 directly contact with the terminals (not illustrated) formed on the through wiring board THWB, and they are heated at a high temperature. As a result, the solder of the pillar-shaped bump electrodes PLBMP1 (PLBMP2) are melted, and the terminals TE1 (TE2) on the through wiring board THWB and the copper of the pillar-shaped bump electrodes PLBMP1 (PLBMP2) are electrically connected to each other. At this time, the underfill UF is wetly expanded to be filled inside the space between the semiconductor chip CHP2 and the through wiring board THWB. In addition, since the rapid curing resin NCP is used as the underfill UF, the underfill UF cures. Here, in the present embodiment, since the pillar-shaped bump electrodes PLBMP1 (PLBMP2) which can secure their heights even if their sizes are made small are used for the connection between the semiconductor chip CHP2 and the through wiring board THWB, the wet expansion of the underfill UF cannot be interrupted.

Figure 17:
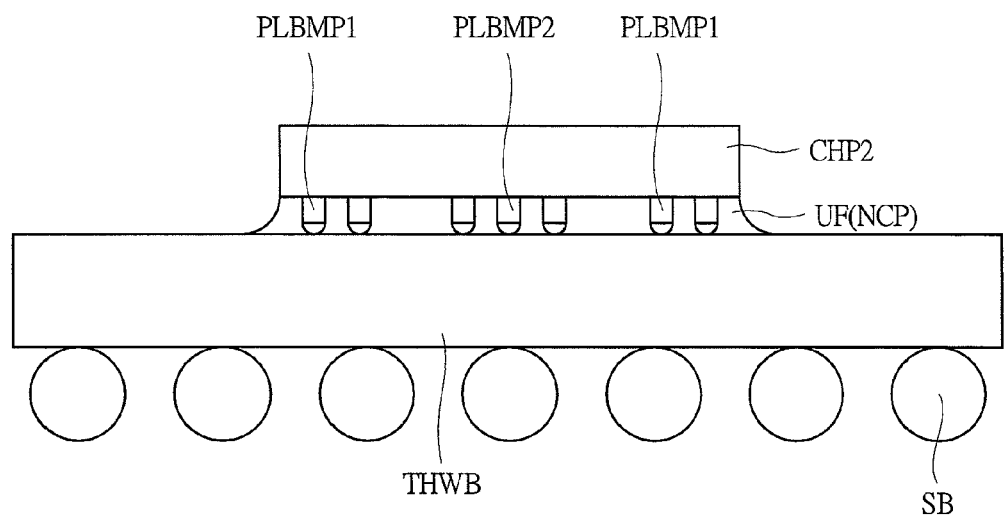
FIG. 17 is a side view illustrating a step of manufacturing the semiconductor device continued from FIG. 16.

Subsequently, as illustrated in FIG. 17, the solder balls SB are mounted on the back surface (the surface opposite to the chip-mounting surface) of the through wiring board THWB. As described above, the semiconductor device in the present embodiment can be manufactured.

Figure 18:
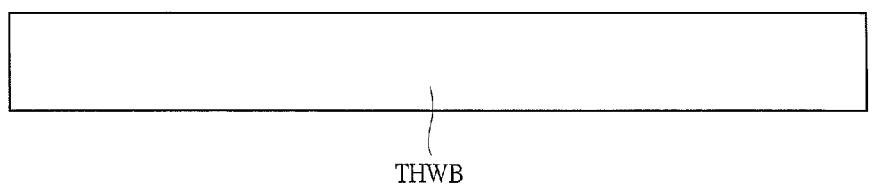
FIG. 18 is a side view illustrating another step of manufacturing the semiconductor device according to the embodiment.

Next, another method of manufacturing the semiconductor device in the present embodiment will be explained. First, as illustrated in FIG. 18, the through wiring board THWB in the present embodiment is prepared. The through wiring board THWB has the layout configuration as illustrated in, for example, FIG. 7, in which the terminals TE1, TE2, the through-holes TH1 and TH2, and others are formed.

Figure 19:
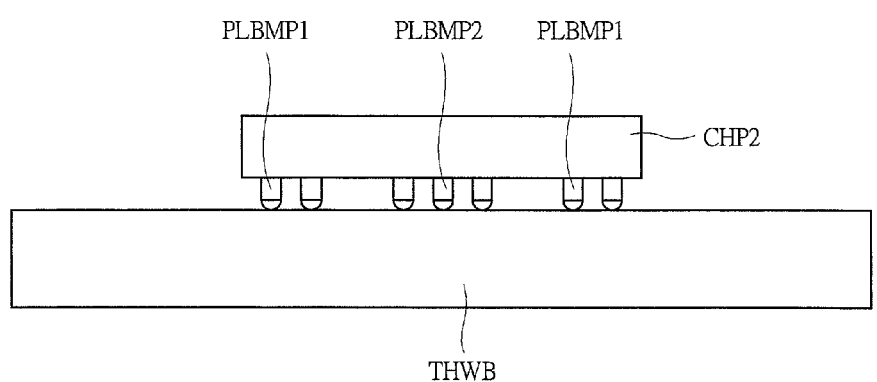
FIG. 19 is a side view illustrating a step of manufacturing the semiconductor device continued from FIG. 18.

Subsequently, as illustrated in FIG. 19, the semiconductor chip CHP2 is mounted on the through wiring board THWB. For example, the pillar-shaped bump electrode PLBMP1 and the pillar-shaped bump electrode PLBMP2 as illustrated in FIG. 4 have been formed on the surface (main surface) of the semiconductor chip CHP2 to be mounted at this time. And, the semiconductor chip CHP2 is mounted on the through wiring board THWB so that the pillar-shaped bump electrodes PLBMP1 (PLBMP2) formed on the semiconductor chip CHP2 directly contact with terminals (not illustrated) formed on the through wiring board THWB. Then, they are heated at a high temperature to melt the solder of the pillar-shaped bump electrodes PLBMP1 (PLBMP2), so that the terminals TE1 (TE2) on the through wiring board THWB and the copper of the pillar-shaped bump electrodes PLBMP1 (PLEMP2) are electrically connected to each other.

Figure 20:
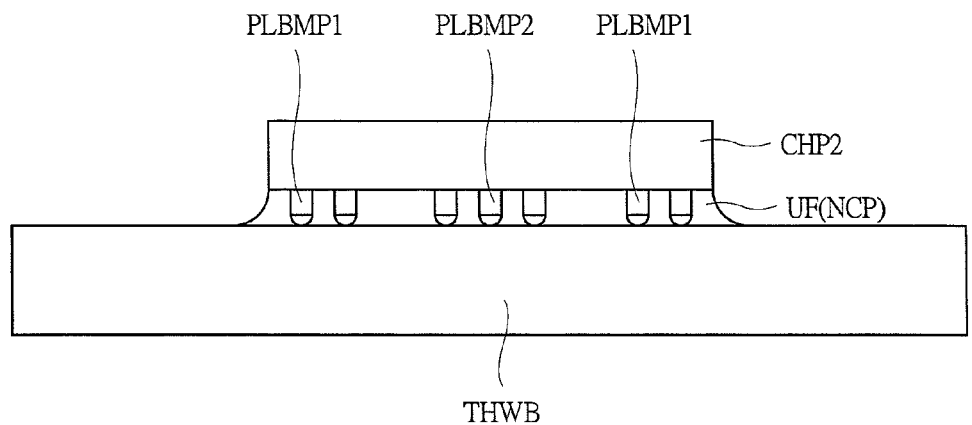
FIG. 20 is a side view illustrating a step of manufacturing the semiconductor device continued from FIG. 19.

And, as illustrated in FIG. 20, the underfill UF is filled inside the space between the semiconductor chip CHP2 and the through wiring board THWB. Here, in the present embodiment, since the pillar-shaped bump electrodes PLBMP1 (PLBMP2) which can secure their heights even if their sizes are made small are used for the connection between the semiconductor chip CHP2 and the through wiring board THWB, the filling property of the underfill UF can be secured.

Figure 21:
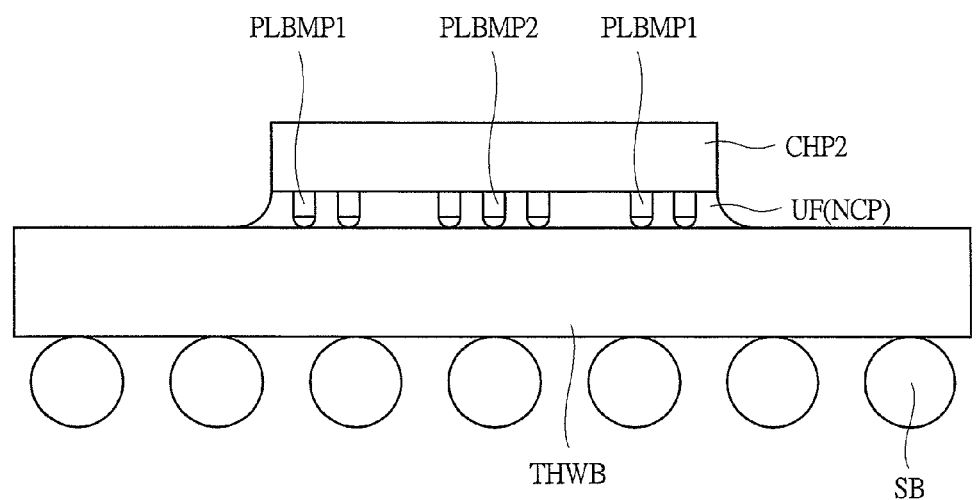
FIG. 21 is a side view illustrating a step of manufacturing the semiconductor device continued from FIG. 20.

Then, as illustrated in FIG. 21, the solder balls SB are mounted on the back surface (the surface opposite to the chip-mounting surface) of the through wiring board THWB. As described above, the semiconductor device in the present embodiment can be manufactured.

Modified Example

Next, a modified example of the present embodiment will be explained. In the above-described embodiment, the example that the bump electrodes formed on the semiconductor chip CHP2 are formed of the pillar-shaped bump electrodes PLBMP1 (PLBMP2) has been described. However, in this modified example, an example that the bump electrodes formed on the semiconductor chip CHP2 are formed of stud bump electrodes will be explained.

Figure 22:
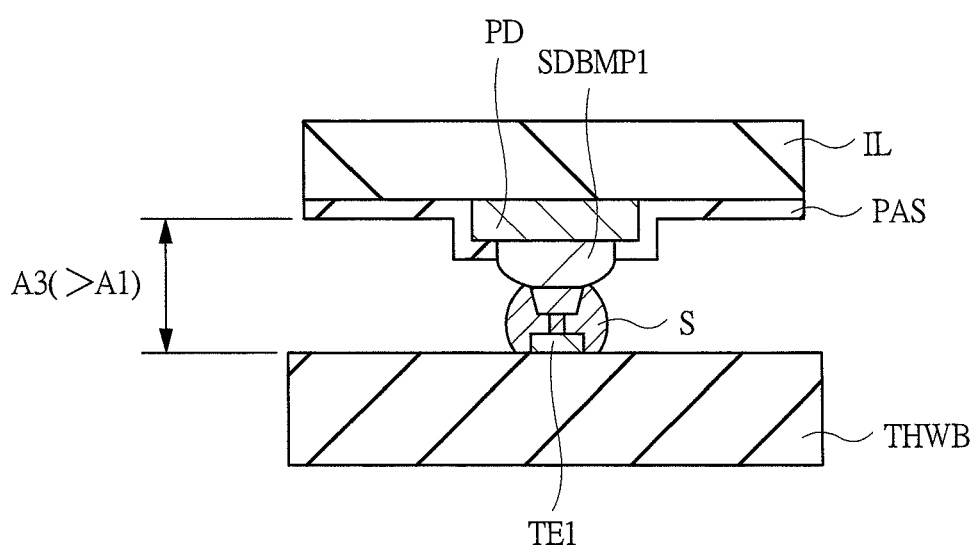
FIG. 22 is a cross-sectional view illustrating a state that a stud bump electrode made of gold is mounted on a through wiring board.

FIG. 22 is a cross-sectional view illustrating a state that a stud bump electrode SDBMP1 made of, for example, gold is mounted on the through wiring board THWB. As illustrated in FIG. 22, the terminal TE1 is formed on the through wiring board THWB, and the stud bump electrode SDBMP1 is mounted on this terminal TE1, and besides, solder S is formed so as to cover a connection portion between the terminal TE1 and the stud bump electrode SDBMP1. The stud bump electrode SDBMP1 is formed in the opening OP formed in the passivation film (surface protection film) PAS formed of, for example, the silicon nitride film, and the stud bump electrode SDBMP1 is formed on the pad PD exposed from the opening OP. And, the pad PD is formed on the interlayer insulation film IL.

In the stud bump electrode SDBMP1 configured as described above, even if a size of the stud bump electrode SDBMP1 is made small, a space (stand-off) A3 (>A1) between the semiconductor chip and the through wiring board THWB can be secured. That is, even here, a material is so that a melding point of the stud bump electrode SDBMP1 (second portion) is higher than a melting point of the solder S (first portion). In this manner, when the stud bump electrode SDBMP1 (second portion) is electrically connected to the terminal TE1 on the through wiring board TWHB by melting the solder S (first portion) at the high temperature, the stud bump electrode SDBMP1 does not melt at the high temperature since the melding point of the stud bump electrode SDBMP1 (second portion) is higher than the melding point of the solder S (first portion). Therefore, the size of the space (stand-off) A3 between the semiconductor chip and the through wiring board THWB is not made smaller than the height of the stud bump electrode SDBMP 1 (second portion made of gold).

As a result, when the stud bump electrode SDBMP1 as illustrated in FIG. 22 is used, the stand-off can be secured even if the size of the stud bump electrode SDBMP1 itself is made small, and therefore, the reduction of the filling property of the underfill and the reduction of the connection reliability between the semiconductor chip and the through wiring board THWB can be suppressed. As described above, the stud bump electrode SDBMP1 which has been explained in this modified example can be also used instead of the pillar-shaped bump electrode PLBMP1 (PLBMP2) which has been explained in the above-described embodiment.

Note that, while the case that gold is used for the stud bump electrode SDBMP1 has been here exemplified for the explanation, for example, a copper stud bump electrode formed by using a copper wire may be used.

The semiconductor device in this modified example is configured as described above, and one example of a manufacturing method thereof will be explained below.

Figure 23:
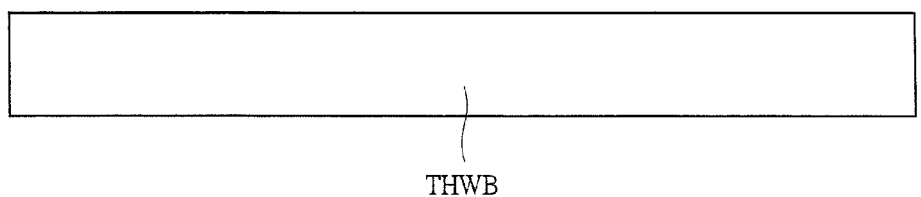
FIG. 23 is a side view illustrating a step of manufacturing a semiconductor device according to a modification example.

First, as illustrated in FIG. 23, the through wiring board THWB in this modified example is prepared. The through wiring board THWB has the layout configuration as illustrated in, for example, FIG. 7, in which the terminals TE1, TE2, the through-holes TH1 and TH2, and others are formed.

Figure 24:
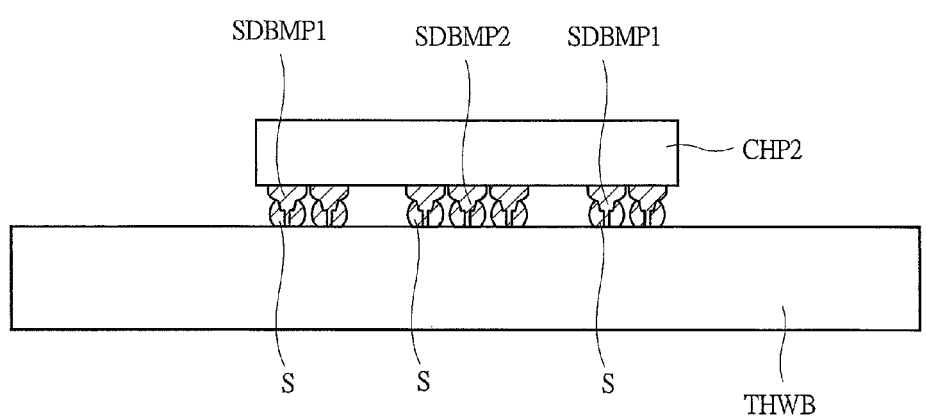
FIG. 24 is a side view illustrating a step of manufacturing the semiconductor device continued from FIG. 23.

Subsequently, as illustrated in FIG. 24, the semiconductor chip CHP2 is mounted on the through wiring board THWB. For example, stud bump electrodes SDBMP1 and SDBMP2 have been formed on the surface (main surface) of the semiconductor chip CHP2 to be mounted at this time. And, a connection portion is formed by melting the solder S so that the stud bump electrodes SDBMP1 and SDBMP2 formed on the semiconductor chip CHP2 directly contact with the terminals (not illustrated) formed on the through wiring board THWB and so as to cover the terminals TE1 and the stud bump electrodes SDBMP1 and SDBMP2. In this manner, the semiconductor chip CHP2 is mounted on the through wiring board THWB. Note that assembling can be facilitated by previously coating the terminals TE1 with the solder S (previously performing solder pre-coating).

Figure 25:
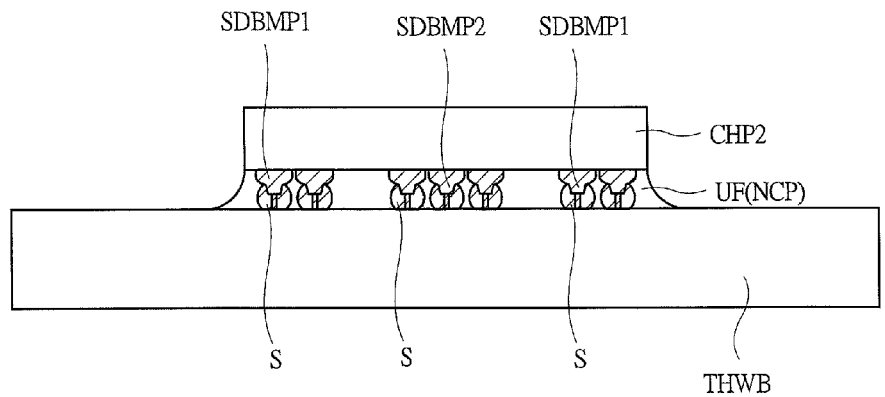
FIG. 25 is a side view illustrating a step of manufacturing the semiconductor device continued from FIG. 24.

And, as illustrated in FIG. 25, the underfill UF is filled into the space between the semiconductor chip CHP2 and the through wiring board THWB. Here, in this modified example, since the stud bump electrodes SDBMP1 and SDBMP2 which can secure their heights even if their sizes are made small are used for the connection between the semiconductor chip CHP2 and the through wiring board THWB, the filling property of the underfill UF can be secured.

Figure 26:
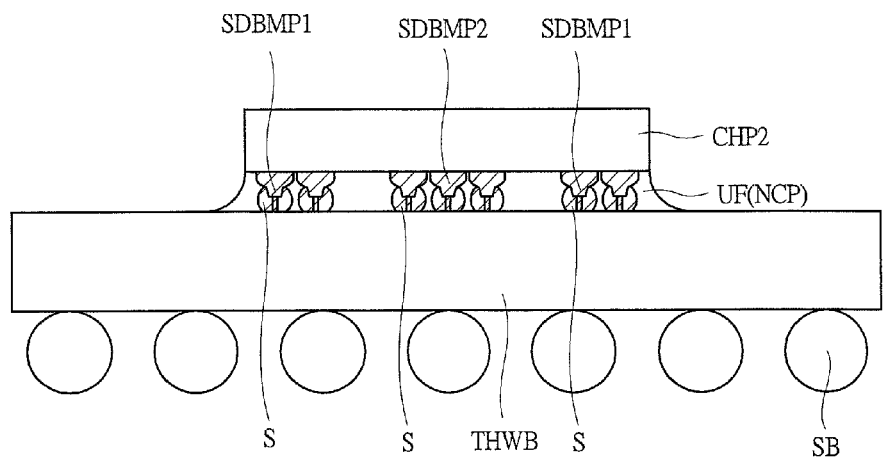
FIG. 26 is a side view illustrating a step of manufacturing the semiconductor device continued from FIG. 25.

Then, as illustrated in FIG. 26, the solder balls SB are mounted on the back surface (the surface opposite to the chip-mounting surface) of the through wiring board THWB. As described above, the semiconductor device in this modified example can be manufactured.

Note that, while the manufacturing method (assembling method) of mounting the semiconductor chip CHP2 on the through wiring board THWB, and then, of filling of the underfill UF has been explained here, the method is not limited to this. The assembling may be performed by a manufacturing method of previously applying the underfill UF (rapid curing resin NCP) onto the above-described through wiring board THWB, and then, of mounting the semiconductor chip CHP2 thereon.

Placement of Present Invention

Figure 27:
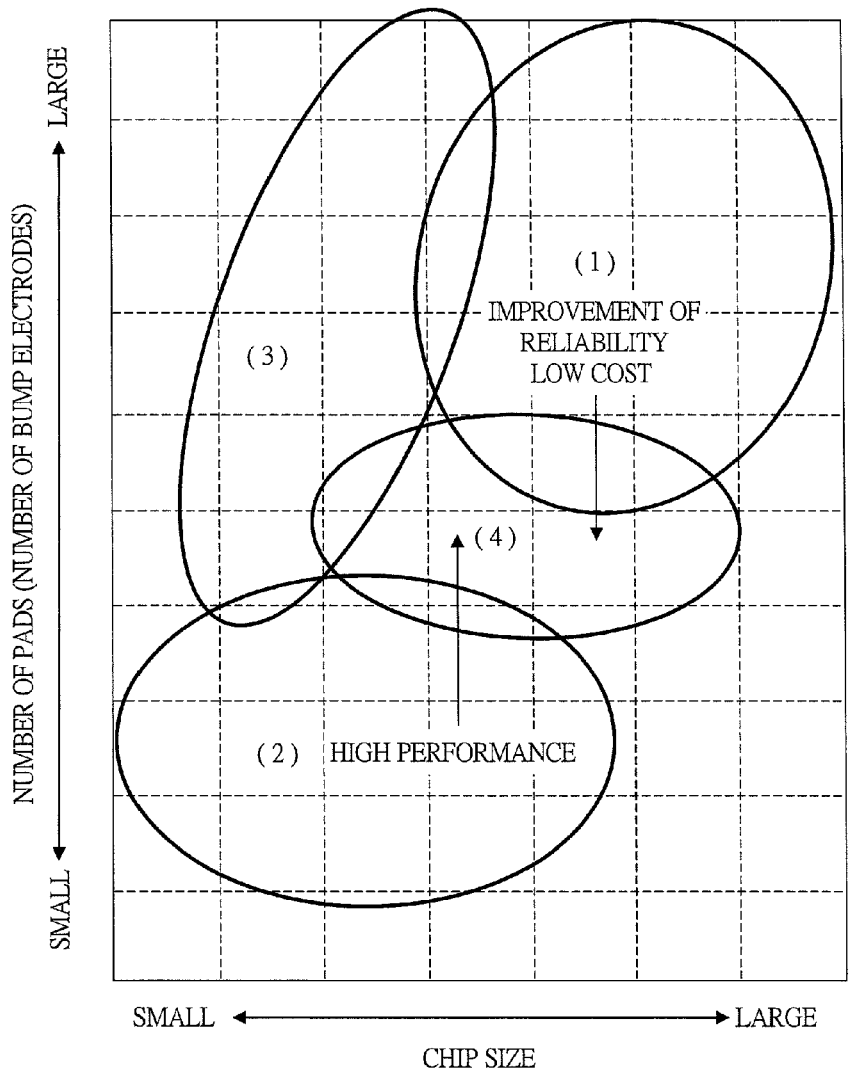
FIG. 27 is a graph for explaining placement of the present invention.

Finally, placement of the present invention will be explained with reference to the drawings. FIG. 27 is a graph for explaining the placement of the present invention. In FIG. 27, a horizontal axis indicates the chip size, and a vertical axis indicates the number of pads (the number of bump electrodes) formed on a chip.

First, a structure of a semiconductor device used in an area indicated by an area (1) will be explained. A mode of the semiconductor device used in the area (1) is a mode in which the build-up wiring board is used as the wiring board and in which arrangement of the hemispherical bump electrodes formed on the semiconductor chip is area bump arrangement (for example, the arrangement illustrated in FIG. 1).

Next, a structure of a semiconductor device used in an area indicated by an area (2) will be explained. A mode of the semiconductor device used in the area (2) is a mode in which the through wiring board is used as the wiring board and in which pads are formed in a peripheral edge portion of a semiconductor chip instead of the formation of the bump electrodes on the semiconductor chip. More specifically, this mode indicates a wire bonding structure.

Subsequently, a structure of a semiconductor device used in an area indicated by an area (3) will be explained. A mode of the semiconductor device used in the area (3) is a mode in which the build-up wiring board is used as the wiring board and in which arrangement of the pillar-shaped bump electrodes formed on the semiconductor chip is area bump arrangement.

Finally, a structure of a semiconductor device used in an area indicated by an area (4) will be explained. A mode of the semiconductor device used in the area (4) is a mode of the present invention in which the through wiring board is used as the wiring board and in which the pillar-shaped bump electrodes are formed on the semiconductor chip.

Here, advantage of modification from the mode of the semiconductor device illustrated in the area (1) to the mode (the mode of the present invention) of the semiconductor device illustrated in the area (4) is that the reliability of the semiconductor device can be improved by using the through wiring board without using the build-up wiring board. That is, the reliability can be improved by not using the fine via and the build-up layer. Further, the cost of the semiconductor device can be reduced by changing an expensive build-up wiring board into an inexpensive through wiring board. More particularly, in the mode of the semiconductor device illustrated in the area (1), when the wiring layout is performed on the build-up wiring board, a wasteful area on the board is increased because the number of bump electrodes is relatively small. However, in a case of such a product that the wiring layout is made possible even on the through wiring board by using the features of the present invention explained above, availability of the modification of the mode into the mode (the mode of the present invention) of the semiconductor device illustrated in the area (4) is enhanced.

Meanwhile, advantage of modification from the mode of the semiconductor device illustrated in the area (2) to the mode (the mode of the present invention) of the semiconductor device illustrated in the area (4) is that high performance of the semiconductor device can be achieved by supplying the power supply voltage and the reference voltage from not only the peripheral edge portion of the semiconductor chip but also from the central portion of the semiconductor chip. That is, while the power supply into the semiconductor chip can be performed from only the pads formed in the peripheral edge portion of the semiconductor chip in the mode of the semiconductor device illustrated in the area (2), the power supply can be performed from not only the peripheral edge portion of the semiconductor chip but also the central portion thereof in the mode (the mode of the present invention) of the semiconductor device illustrated in the area (4), so that the power supply drop (IR drop) within the semiconductor chip can be reduced. More particularly, in the mode of the semiconductor device illustrated in the area (2), in a case of such a product that the power supply voltage is relatively low, availability of modification to the mode (the mode of the present invention) of the semiconductor device illustrated in the area (4) is enhanced.

Further, the mode of the semiconductor device illustrated in the area (2) is specifically the wire bonding structure. When the number of pins (the number of pads) is increased, if the pads are arranged without increasing the chip size, it is required to provide the pads in the vicinity of the center of the semiconductor chip. A wire length in this case is longer than a wire length of a wire drawn in pads in the peripheral edge portion of the semiconductor chip, and therefore, it is difficult to perform the wire bonding because wire sweep tends to occur in the sealing with the sealing resin or others. Even in such a case, by using the features of the present invention described above, the bump electrodes can be arrange in not only the peripheral area of the semiconductor chip but also the central area thereof. As a result, the size of the semiconductor chip can be equal to or smaller than that in the wire bonding structure in some cases, and therefore, availability of modification of the mode into the mode (the mode of the present invention) of the semiconductor device illustrated in the area (4) is enhanced.

In the foregoing, the invention made by the present inventors has been concretely described based on the embodiments. However, it is needless to say that the present invention is not limited to the foregoing embodiments and various modifications and alterations can be made within the scope of the present invention.

Note that the above-described MOSFET is not limited to the case that a gate insulation film is formed of an oxidation film, but is assumed to also include a MISFET (Metal Insulator Semiconductor Field Effect Transistor) obtained by forming the gate insulation film from various insulation films. That is, in the present specification, the term MOSFET has been used for the convenience. However, the MOSFET is used as the term directed to also contain the MISFET in the present specification.

Further, the BGA package structure in which the solder balls SB are mounted on the back surface (the surface opposite to the chip-mounting surface) of the through wiring board THWB has been exemplified here for the explanation. However, the present invention can be applied to an LGA (Land Grid Array) package without mounting the solder balls SB. When the solder balls SB are not mounted, a material cost can be reduced correspondingly.

INDUSTRIAL APPLICABILITY

The present invention can be widely used in manufacture industry which manufactures a semiconductor device.

SYMBOL EXPLANATION

AR0 area
AR1 area
AR2 area
AR3 area
A1 space
A2 space
A3 space
BMP bump electrode
BPL1 build-up layer
BPL2 build-up layer
BPWB build-up wiring board
BTE back-surface terminal
CHP1 semiconductor chip
CHP2 semiconductor chip
CRL core layer
HS heat sink
IL interlayer insulation film
LND1 land
LND2 land
LND3 land
OP opening
OP1 opening PAS passivation film
PD pad
PI1 resin film
PI2 resin film
PIBMP1 pillar-shaped bump electrode
PIBMP2 pillar-shaped bump electrode
RW rewiring
S solder
SB solder ball
SCE silicon resin
SDBMP1 stud bump electrode
SDBMP2 stud bump electrode
SR solder resist
TE terminal
TE1 terminal
TE2 terminal
TH1 through-hole
TH2 through-hole
TH3 through-hole
THWB through wiring board
UF underfill
VA via
WIRE1 wire
WIRE2 wire
WIRES wire

The invention claimed is:

1. A semiconductor device comprising:
(a) a semiconductor chip having a surface on which a plurality of protruding electrodes are arranged;
(b) a wiring board including a core layer, the core layer having a first front surface on which a plurality of terminals corresponding to the plurality of protruding electrodes are arranged, and a first back surface opposite the first front surface, the semiconductor chip being mounted over the first front surface so that the plurality of protruding electrodes are electrically connected to the plurality of terminals, respectively; and
(c) a sealing resin filled between the semiconductor chip and the wiring board,
wherein the plurality of protruding electrodes includes a plurality of first protruding electrodes and a plurality of second protruding electrodes, and the plurality of terminals includes a plurality of first terminals and a plurality of second terminals,
wherein the core layer includes the plurality of first terminals, a plurality of first through-holes, and the plurality of second terminals,
wherein the plurality of first terminals are arranged in a first area of the first front surface of the core layer, each of the plurality of first terminals being electrically connected to a respective first protruding electrode of the plurality of first protruding electrodes of the semiconductor chip,
wherein the plurality of first through-holes are arranged in a second area of the first front surface of the core layer, the second area being closer to a center portion of the core layer than the first area is,
wherein the plurality of second terminals are arranged in a third area of the first front surface of the core layer, the third area being closer to the center portion of the core layer than the second area is, each of the plurality of second terminals being electrically connected to a respective second protruding electrode of the plurality of second protruding electrodes of the semiconductor chip,
wherein each of the plurality of first through-holes penetrates from the first front surface of the core layer to the first back surface of the core layer,
wherein some of the plurality of first through-holes are electrically connected to respective first terminals of the plurality of first terminals,
wherein, in a plan view, the plurality of protruding electrodes of the semiconductor chip are not overlapped with the plurality of first through-holes,
wherein the plurality of first terminals include first supply terminals which are configured to supply a first power supply voltage or a first reference voltage from outside, and first signal terminals which are configured to transmit a signal voltage to the outside, and
wherein the plurality of second terminals include only second supply terminals which are configured to supply a second power supply voltage or a second reference voltage from the outside.

2. The semiconductor device according to claim 1,
wherein, in the plan view, the plurality of protruding electrodes of the semiconductor chip are not overlapped with the second area of the core layer.

3. The semiconductor device according to claim 1,
wherein a plurality of third through-holes are further formed in the third area of the core layer, and
wherein each of the plurality of second terminals is electrically connected to a corresponding third through-hole of the plurality of third through-holes via a wiring in the first front surface of the core layer.

4. The semiconductor device according to claim 1,
wherein a plurality of second through-holes are further formed in a fourth area of the core layer, the fourth area being further from the center portion of the core layer than the first area is, and
wherein some of the plurality of second through-holes are electrically connected to respective first terminals of the plurality of first terminals.

5. The semiconductor device according to claim 4,
wherein the plurality of first terminals are arranged in a plurality of rows,
wherein the first terminals which are electrically connected to corresponding first through-holes of the plurality of first through-holes are arranged so as to be closer to the center portion of the core layer than the first terminals which are electrically connected to corresponding second through-holes of the plurality of second through-holes.

6. The semiconductor device according to claim 4,
wherein there are more of the second through-holes than there are of the first through-holes.

7. The semiconductor device according to claim 4,
wherein, in the plan view, the fourth area is located outside of an outer periphery of the semiconductor chip.

8. The semiconductor device according to claim 1,
wherein each of the plurality of protruding electrodes has a first portion electrically connected to a respective terminal of the plurality of terminals of the core layer and a second portion having a higher melting point than a melting point of the first portion.

9. The semiconductor device according to claim 8,
wherein the first portion is made of solder, and the second portion is made of copper or gold.

10. The semiconductor device according to claim 1,
wherein a first solder resist having an opening formed therein is formed on the first front surface of the core layer, and
wherein the first terminals are exposed from the opening formed in the first solder resist.

11. The semiconductor device according to claim 10,
wherein the first solder resist fills the plurality of first through-holes.

12. The semiconductor device according to claim 10,
wherein a second solder resist is formed on the first back surface of the core layer.

13. The semiconductor device according to claim 1,
wherein a plurality of lands are formed on the first front surface of the core layer,
wherein the plurality of lands are electrically connected to the plurality of first through-holes, respectively, and
wherein some of the plurality of first terminals are electrically connected to respective lands of the plurality of lands via corresponding wires.

14. The semiconductor device according to claim 1,
wherein a resin film is formed on the surface of the semiconductor chip, and
wherein a rewiring is not formed on the resin film.

15. The semiconductor device according to claim 1,
wherein a passivation film including a silicon nitride film is formed on the surface of the semiconductor chip, and
wherein a rewiring is not formed on the passivation film.

16. The semiconductor device according to claim 1,
wherein the plurality of second terminals are configured to supply the second power supply voltage or the second reference voltage to a core circuit which is formed in the semiconductor chip.

17. The semiconductor device according to claim 16,
wherein the first supply terminals of the plurality of first terminals which are configured to supply the first power supply voltage or the first reference voltage supply the first power supply voltage or the first reference voltage to an external interface circuit which is formed in the semiconductor chip.

18. The semiconductor device according to claim 17,
wherein an electrical potential of the second power supply voltage is lower than an electrical potential of the first power supply voltage.

19. The semiconductor device according to claim 1,
wherein the core layer contains glass cloth.

* * * * *